United States Patent
Tsai et al.

(10) Patent No.: US 9,478,480 B2
(45) Date of Patent: Oct. 25, 2016

(54) ALIGNMENT MARK AND METHOD OF FORMATION

(71) Applicant: Taiwan Semiconductor Manufacturing Company, Ltd., Hsin-Chu (TW)

(72) Inventors: Chen-Yu Tsai, Zhongli (TW); Shih-Hui Wang, Zhonghe (TW); Chien-Ming Chiu, Hsin-Chu (TW); Chia-Ho Chen, Zhubei (TW); Fang Wen Tsai, Hsin-Chu (TW); Weng-Jin Wu, Hsin-Chu (TW); Jing-Cheng Lin, Hsin-Chu (TW); Wen-Chih Chiou, Zhunan Township (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/542,317

(22) Filed: Nov. 14, 2014

(65) Prior Publication Data

US 2015/0069580 A1    Mar. 12, 2015

Related U.S. Application Data

(63) Continuation of application No. 12/827,563, filed on Jun. 30, 2010, now Pat. No. 8,896,136.

(51) Int. Cl.
| | |
|---|---|
| H01L 23/544 | (2006.01) |
| H01L 23/48 | (2006.01) |
| H01L 21/683 | (2006.01) |
| H01L 21/306 | (2006.01) |
| H01L 21/768 | (2006.01) |

(52) U.S. Cl.
CPC ....... H01L 23/481 (2013.01); H01L 21/30604 (2013.01); H01L 21/6835 (2013.01); H01L 21/76831 (2013.01); H01L 21/76877 (2013.01); H01L 21/76898 (2013.01); H01L 23/544 (2013.01); H01L 2221/68327 (2013.01); H01L 2223/54426 (2013.01); H01L 2224/13 (2013.01)

(58) Field of Classification Search
None
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,525,840 A | 6/1996 | Tominaga |
| 5,783,490 A | 7/1998 | Tseng |
| 5,972,793 A | 10/1999 | Tseng |
| 5,998,292 A | 12/1999 | Black et al. |
| 6,157,087 A | 12/2000 | Zhao et al. |

(Continued)

OTHER PUBLICATIONS

Written Opinion, Intellectual Property Office of Singapore, Application No. 201005319-7, Nov. 29, 2013, pp. 1-6.

(Continued)

Primary Examiner — Hoang-Quan Ho
(74) Attorney, Agent, or Firm — Slater Matsil, LLP

(57) ABSTRACT

In accordance with an embodiment, a structure comprises a substrate having a first area and a second area; a through substrate via (TSV) in the substrate penetrating the first area of the substrate; an isolation layer over the second area of the substrate, the isolation layer having a recess; and a conductive material in the recess of the isolation layer, the isolation layer being disposed between the conductive material and the substrate in the recess.

20 Claims, 24 Drawing Sheets

(56) References Cited

U.S. PATENT DOCUMENTS

| | | |
|---|---|---|
| 6,184,060 B1 | 2/2001 | Siniaguine |
| 6,322,903 B1 | 11/2001 | Siniaguine et al. |
| 6,337,522 B1 | 1/2002 | Kang |
| 6,383,888 B1 | 5/2002 | Stirton |
| 6,392,300 B1 | 5/2002 | Koike |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,601,314 B2 | 8/2003 | Machida et al. |
| 6,621,119 B1 | 9/2003 | Wu |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jacson et al. |
| 6,803,291 B1 | 10/2004 | Fu et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,358,602 B2 | 4/2008 | Hara |
| 7,382,037 B2 * | 6/2008 | Umemoto ......... H01L 21/76898 257/620 |
| 2002/0098707 A1 | 7/2002 | Ning |
| 2003/0077897 A1 | 4/2003 | Tsai et al. |
| 2003/0160328 A1 | 8/2003 | Matsubara |
| 2004/0169255 A1 | 9/2004 | Kiyotoshi |
| 2004/0188822 A1 | 9/2004 | Hara |
| 2005/0230804 A1 | 10/2005 | Tanida et al. |
| 2006/0071342 A1 * | 4/2006 | Umemoto ......... H01L 21/76898 257/773 |
| 2006/0141737 A1 | 6/2006 | Gaidis |
| 2006/0264021 A1 * | 11/2006 | Farahani ................ H01L 24/11 438/612 |
| 2008/0035851 A1 | 2/2008 | Takeishi et al. |
| 2008/0054444 A1 * | 3/2008 | Tuttle ................ H01L 21/76898 257/698 |
| 2008/0237888 A1 | 10/2008 | Hayasaka |
| 2009/0166811 A1 | 7/2009 | Fujii |
| 2009/0166846 A1 | 7/2009 | Pratt et al. |
| 2010/0038800 A1 | 2/2010 | Yoon et al. |
| 2010/0096738 A1 * | 4/2010 | Simmons-Matthews ......... H01L 21/76898 257/686 |
| 2010/0182040 A1 | 7/2010 | Feng et al. |
| 2011/0210452 A1 | 9/2011 | Roozeboom |
| 2011/0233785 A1 | 9/2011 | Koester et al. |

OTHER PUBLICATIONS

Tanida et al., "Ultra-high-density 30 Chip Stacking Technology", 2003, Electronic Components and Technology Conference. pp. 1084-1089.

* cited by examiner

ALIGNMENT MARK AND METHOD OF FORMATION

This application is a continuation of U.S. patent application Ser. No. 12/827,563, filed on Jun. 30, 2010, entitled "Alignment Mark and Method of Formation," which disclosure is incorporated herein by reference in its entirety.

BACKGROUND

In semiconductor processing, the formation of structures and devices generally include the sequential formation of one layer of material or composition of materials over another layer. These layers are commonly etched or doped using photolithography techniques to direct the areas where the layers are etched or doped. For example, the formation a source/drain region of a transistor may include forming a photoresist layer over the semiconductor substrate in which a source/drain region is to be formed, exposing the photoresist layer to light such that the volume of photoresist above the area where the source/drain region is to be formed is removed, and doping the semiconductor substrate using the photoresist to prevent unexposed areas from being doped. Further, a contact to the source/drain region may include depositing an insulating layer over the semiconductor substrate, forming a photoresist over the insulating layer, exposing the photoresist to light such that a volume of photoresist over the source/drain region is removed, etching the insulating layer using the photoresist as a mask, and depositing a metal.

The integrity of the devices formed using these photolithography techniques is therefore dependent upon proper alignment of features from one layer to another. In the example above, the contact must be aligned with the source/drain region. Misalignment between these layers may prevent a device from being operational.

The semiconductor processing field has developed alignment marks to allow higher precision in aligning photolithographic processes between layers. Alignment marks allow for the measurement of the placement of a wafer upon which processing has proceeded. Based on a measurement, a stepper may move or modify the position of the wafer to help enable better alignment of the photolithography processes.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely an alignment mark formed during the processing of a die for a stacked device. Other embodiments may also be applied, however, to an interposer or another structure where an alignment mark is used during processing.

FIGS. 1A through 1H illustrate a method for forming an alignment mark for a stacked device according to an embodiment. A structure produced by the method in FIGS. 1A through 1H is shown in FIG. 2. Any sequence described in the method is solely for clarity of description, and the steps of the method may be performed in any logical progression.

Figure 1A:
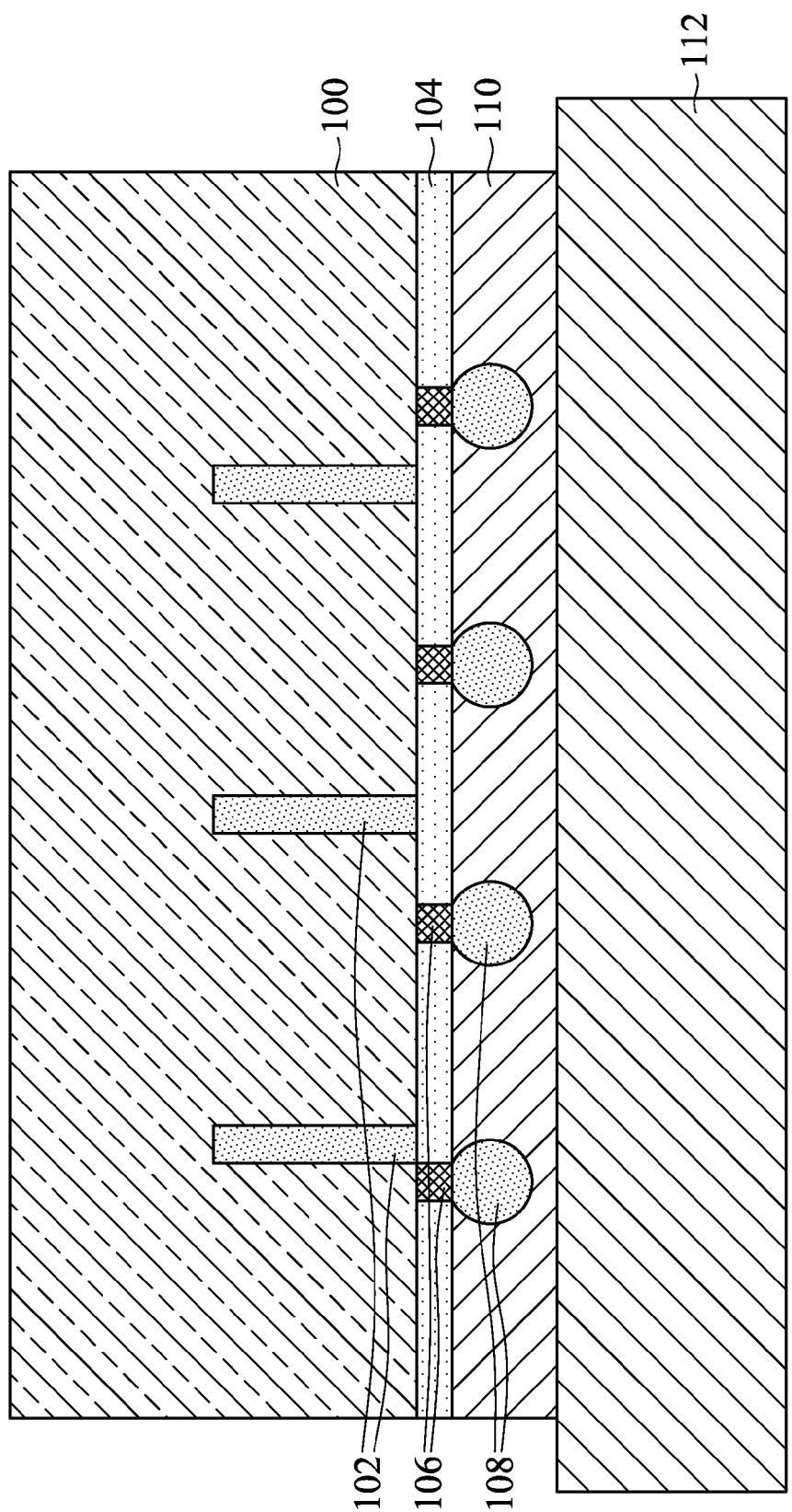
FIGS. 1A through 1H illustrate a method for forming an alignment mark for a stacked device according to an embodiment.
Figure 2:
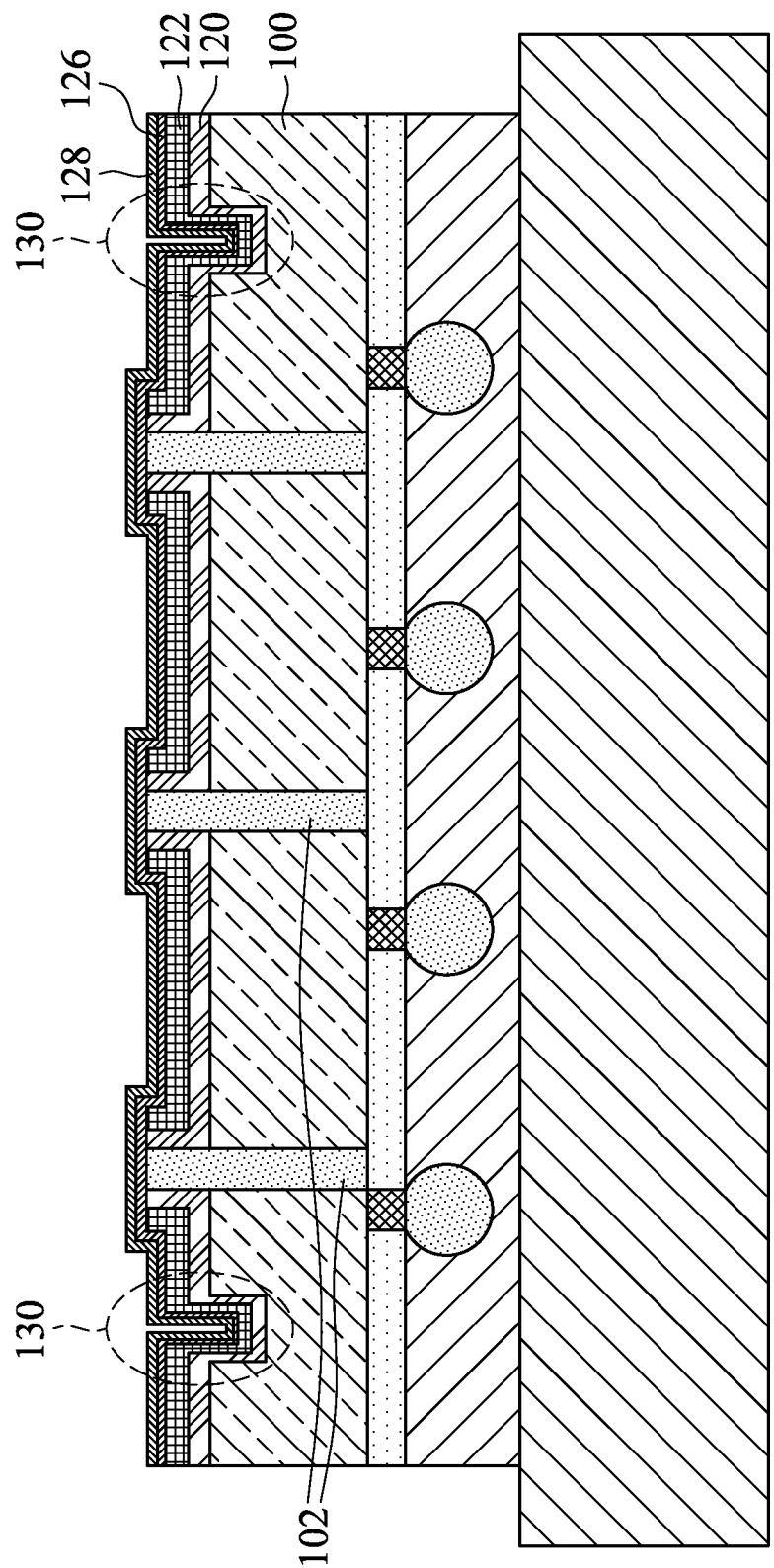
FIG. 2 illustrates a structure having an alignment mark formed by the method described with respect to FIGS. 1A through 1H.

FIG. 1A shows a substrate 100, such as a die of a stacked device, in an intermediate stage of processing, such as after front side processing. Particularly, at this point in processing, through substrate vias (TSVs) 102 have been formed in the substrate 100, one or more metallization layers 104 with interconnect structures 106 have been formed on the substrate 100, and conductive bumps 108 have been formed electrically coupled to the interconnect structures 106. The substrate 100 may be any suitable material, such as silicon. The TSVs 102 may comprise a liner layer, a diffusion barrier layer, an adhesion layer, an isolation layer, and/or the like, and filled with a conductive material. The liner layer may be, for example, silicon nitride, silicon oxide, a polymer material, a combination thereof, and/or the like. The diffusion barrier layers, for example, may comprise one or more layers of TaN, Ta, TiN, Ti, CoW, or the like, and the conductive material may comprise, for example, copper, tungsten, aluminum, silver, combinations thereof, and/or the like, formed by an electro-chemical plating process. The metallization layers 104, interconnect structures 106, and conductive bumps 108 may be any acceptable material and formed with suitable processes, such as those known for back end of the line (BEOL) processing.

Further, the front side of the substrate 100 has been attached by adhesive 110 to a carrier 112 for back side processing. Generally, the carrier 112 provides temporary mechanical and structural support during subsequent processing steps. In this manner, damage to the substrate 100 may be reduced or prevented. The carrier 112 may comprise, for example, glass, silicon oxide, aluminum oxide, and the like. The adhesive 110 may be any suitable adhesive, such as an ultraviolet (UV) glue, which loses its adhesive property when exposed to UV lights. It should be noted that reference numbers 104 through 112 are not explicitly identified in FIGS. 1B through 1H and 2; however, the features corresponding to these reference numbers are present in these figures. The omission of these reference numbers is merely for the clarity of the depictions.

Figure 1B:
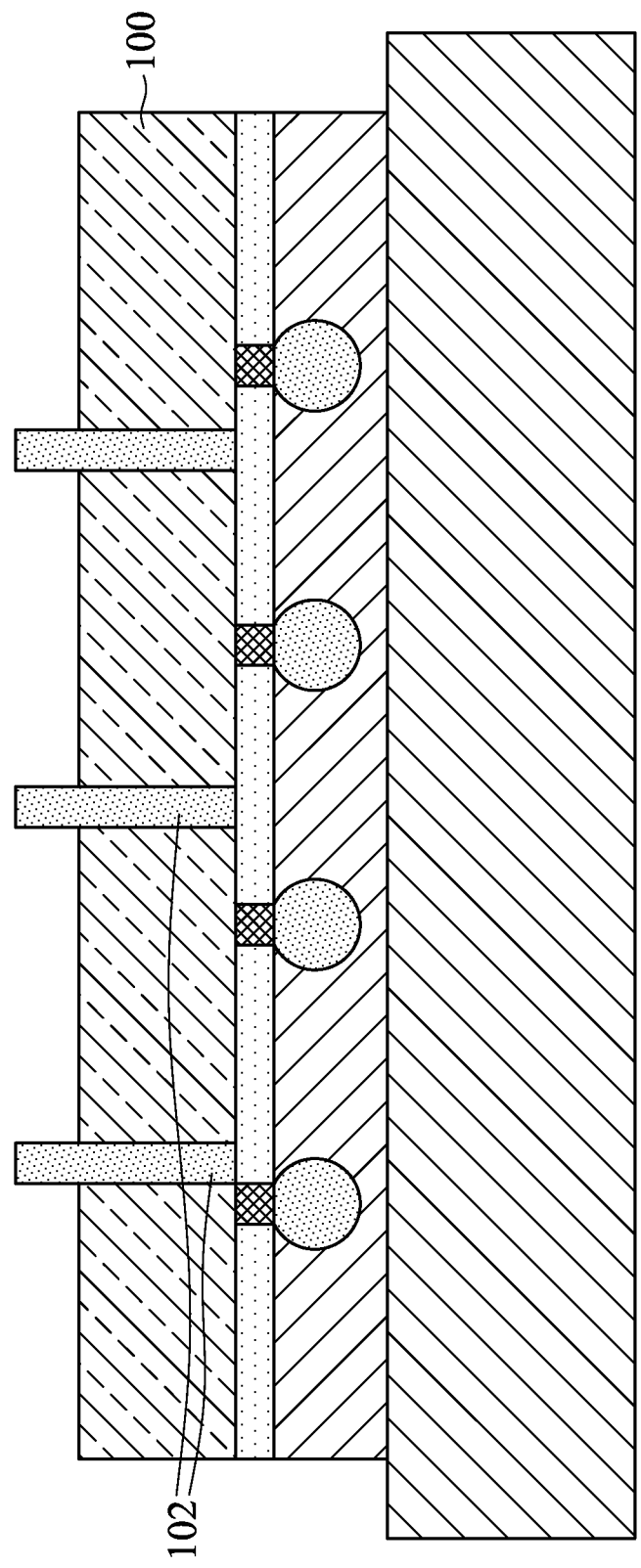

In FIG. 1B, the structure of FIG. 1A is shown after the substrate 100 is thinned and recessed to expose the TSVs 102 through the back side of the substrate 100. The thinning and recessing may result in the substrate 100 being a thin substrate, i.e. approximately 20 micrometers to approximately 200 micrometers in thickness. The thinning and recessing may be performed by a planarization process, an etch process, a combination thereof, and/or the like. For example, initially a planarizing process, such as a chemical mechanical polish (CMP), may be performed to initially expose top surfaces of the TSVs 102. Thereafter, one or more etching processes having a high etch-rate selectivity between the material of the TSVs 102 and the substrate 100 may be performed, thereby leaving the TSVs 102 protruding from the back side of the substrate 100.

Figure 1C:
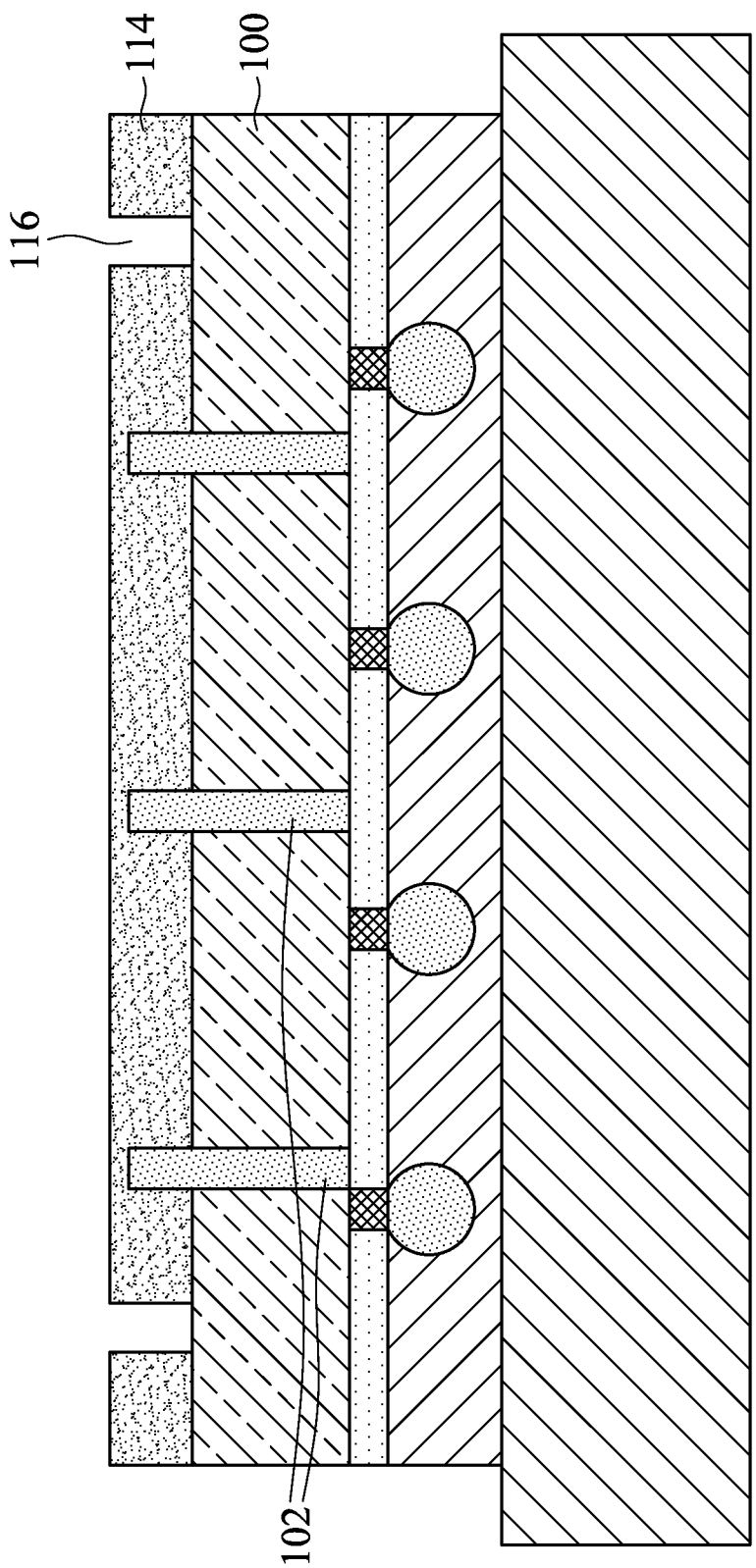
Figure 1D:
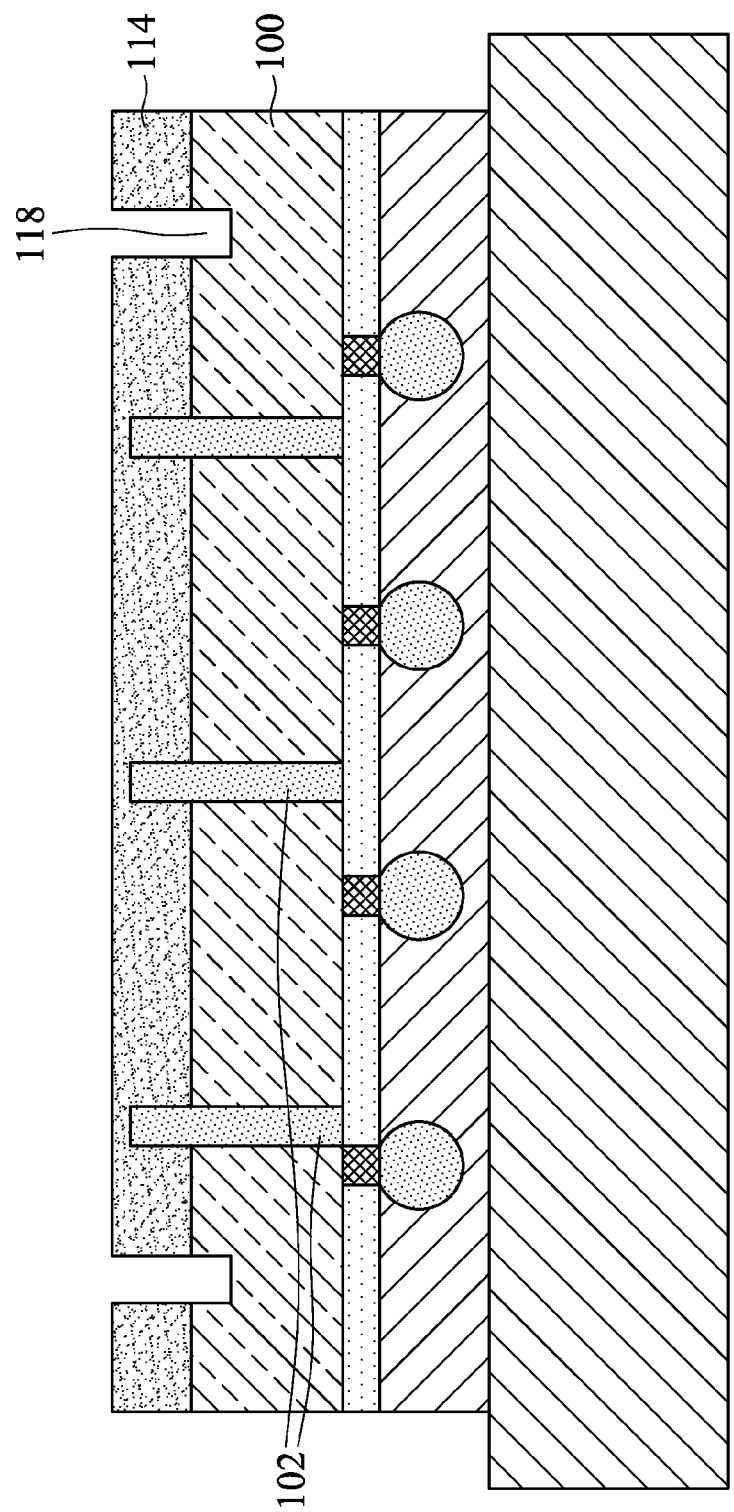
Figure 1E:
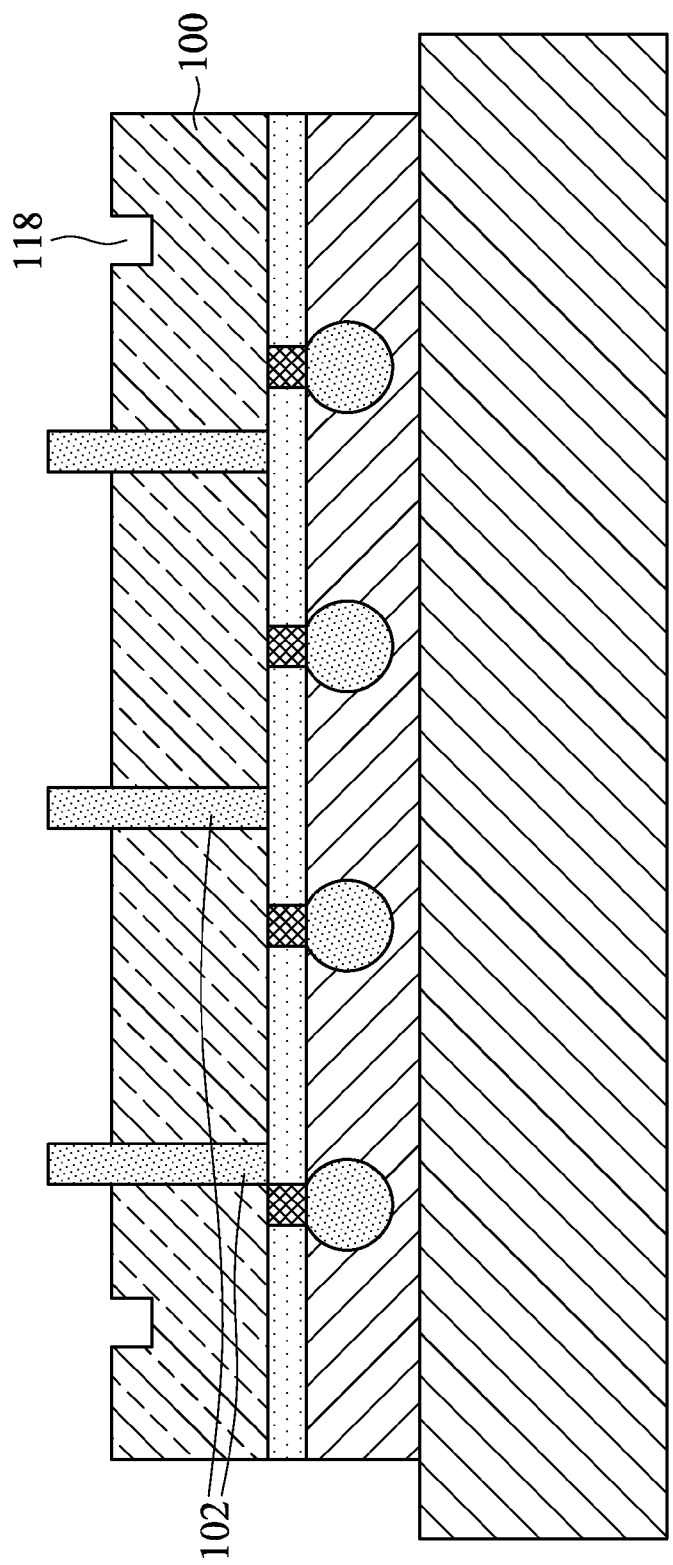

FIG. 1C shows a photoresist layer 114 formed on the back side of the substrate 100. The photoresist layer 114 may have a thickness that is greater than the height of the protruding portions of the TSVs 102. The photoresist layer 114 has openings 116 formed therein. The openings 116 may be formed using acceptable photolithography techniques, such as using a lithography mask to expose the photoresist layer 114 to light where openings 116 are to be formed. After the formation of the openings 116, an etch process, such as an anisotropic etch, is performed to create openings 118 recessed below the surface of the back side of the substrate 100, as illustrated in FIG. 1D. FIG. 1E shows the structure of FIG. 1D after an ash/flush process is performed to remove the photoresist layer 114.

Figure 1F:
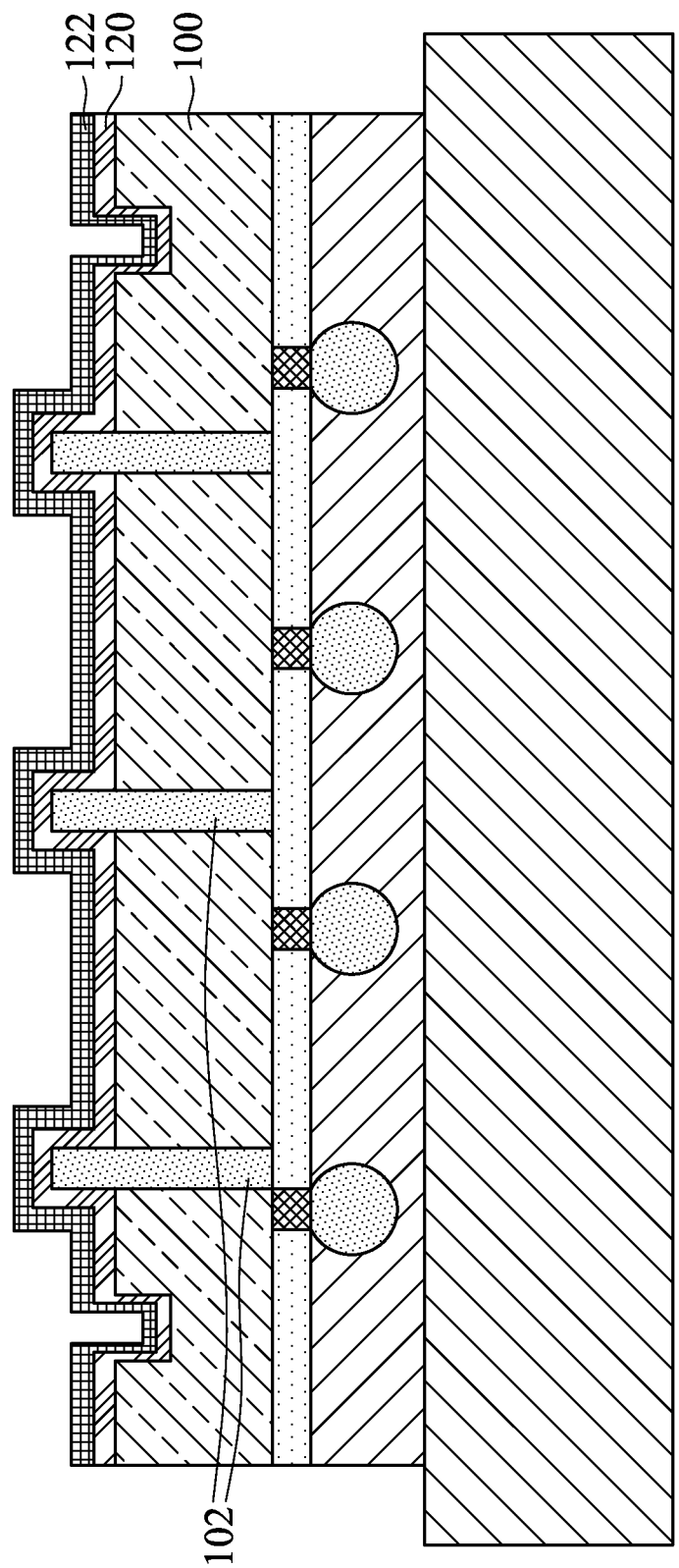

FIG. 1F illustrates the structure in FIG. 1E after the formation of a first isolation layer 120 and a second isolation layer 122. The first and second isolation layers 120 and 122 may be silicon nitride, silicon oxide, silicon carbide, silicon oxynitride, an oxide, a polymer material, a combination thereof, and/or the like. The first and second isolation layers 120 and 122 may further be a single layer or may be multiple layers consisting essentially of the same or different material compositions. In the example shown in FIG. 1F, the first isolation layer 120 is a silicon nitride, and the second isolation layer 122 is a silicon oxide. The first and second isolation layers 120 and 122 may be deposited using acceptable deposition techniques, such as a chemical vapor deposition (CVD) process or, further, by a CVD using a low temperature. As depicted in FIG. 1F, the first isolation layer 120 and the second isolation layer 122 are both formed on exposed top surfaces of the substrate 100 within the openings 118 and both conform to those exposed surfaces.

Figure 1G:
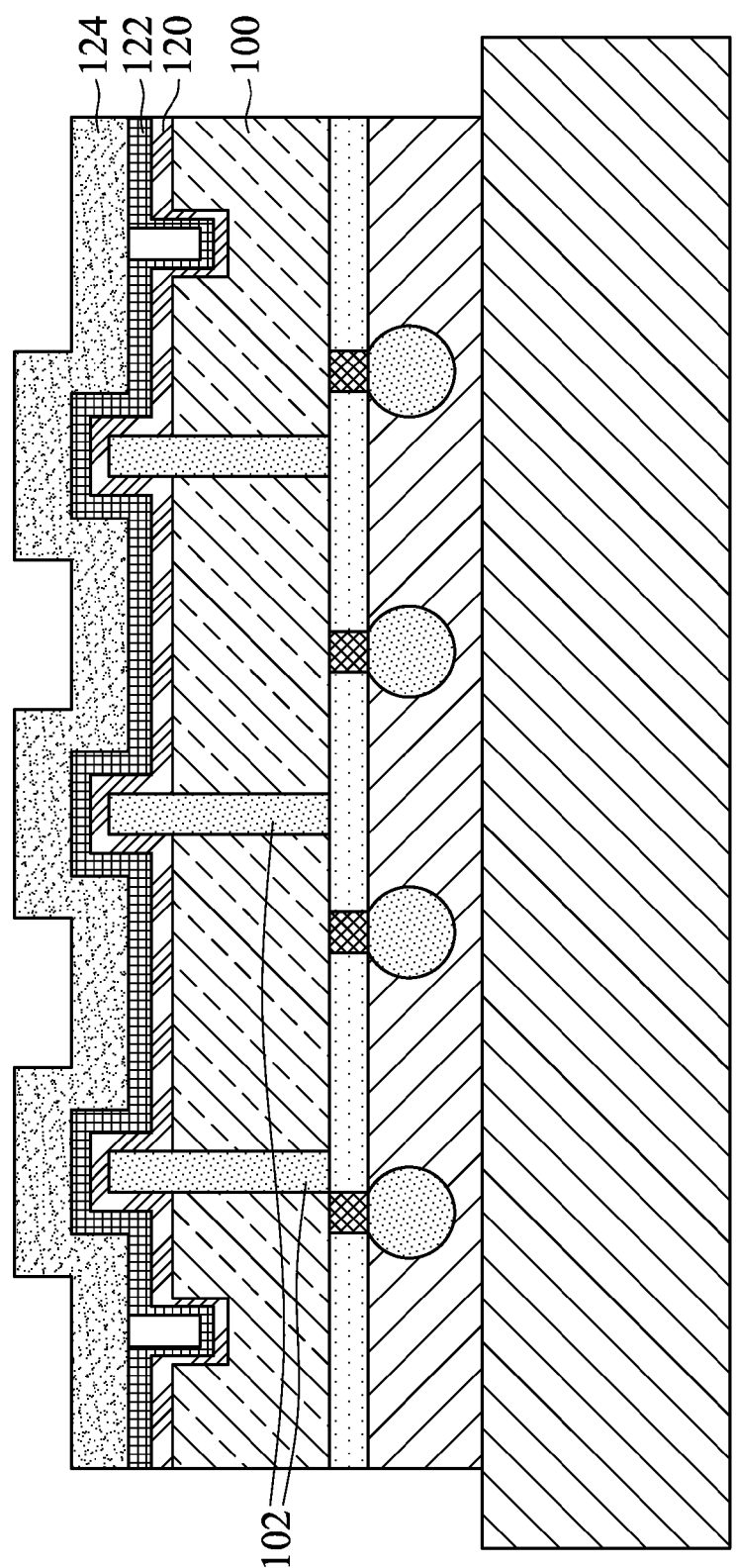
Figure 1H:
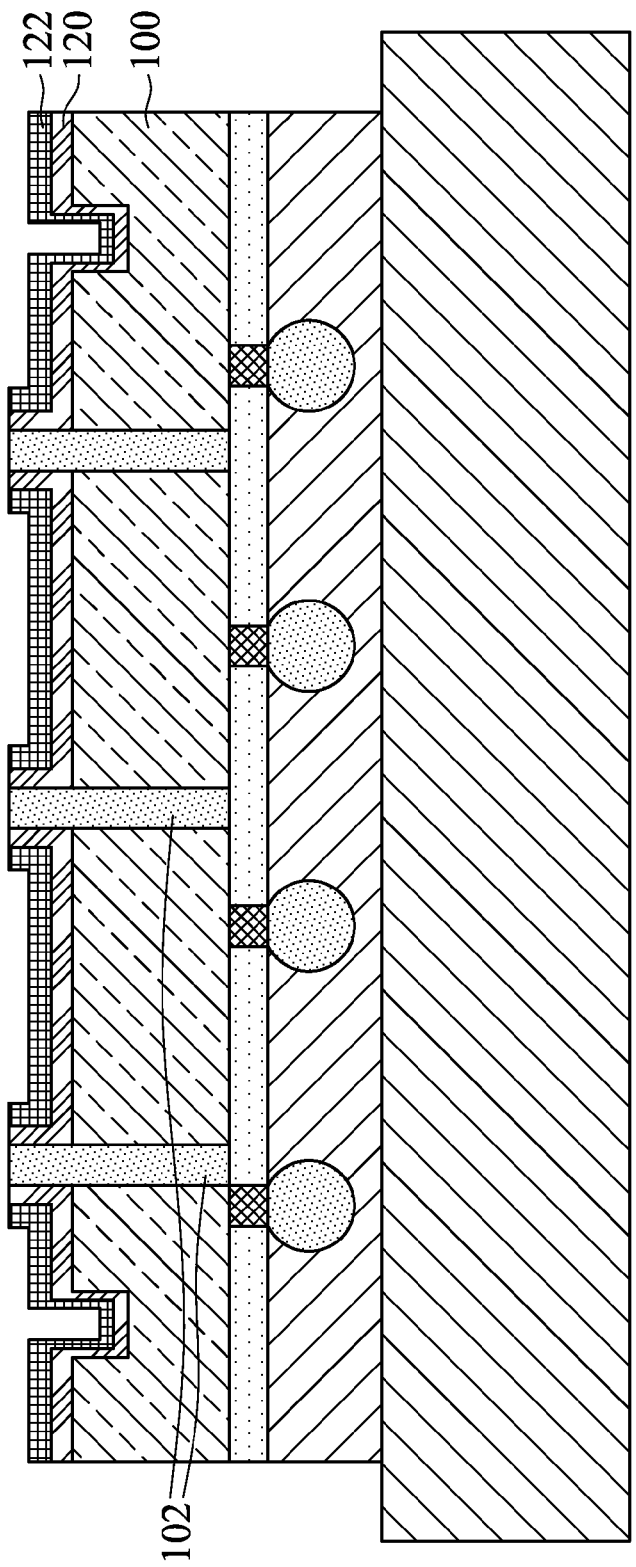

FIG. 1G shows a photoresist layer 124 formed over the second isolation layer 122. The photoresist layer 124 may be patterned, such as by exposing the photoresist layer 124 to light, to allow an etch process to remove portions of the first and second isolation layers 120 and 122 that coat the protruding portions of the TSVs 102. The first and second isolation layers 120 and 122 are then etched, such as by a dry etch, to allow the TSVs 102 to be exposed from under the first and second isolation layers 120 and 122, as shown in FIG. 1H. The etchant used for the etch process may have a high selectivity between the materials used for the TSVs 102 and the second isolation layer 122 and the first isolation layer 120. FIG. 1H further shows the structure after an ash/flush process is performed to remove the photoresist layer 124.

FIG. 2 illustrates a structure having an alignment mark 130 formed by the method described with respect to FIGS. 1A through 1H. As shown in FIG. 2, the structure of FIG. 1H further comprises a first metal layer 126 and a second metal layer 128. The first metal layer 126 may be titanium (Ti), titanium nitride (TiN), titanium tungsten (TiW), titanium silicon nitride (TiSiN), tantalum (Ta), tantalum nitride (TaN), tantalum silicon nitride (TaSiN), tungsten (W), tungsten nitride ($W_2N$), tungsten silicon nitride (WSiN), a combination thereof, and/or the like, and the second metal layer 128 may be copper and/or the like. The first metal layer 126 and the second metal layer 128 may be formed using a suitable deposition technique, such as by a physical vapor deposition (PVD) process, a chemical vapor deposition (CVD) process, or an atomic layer deposition (ALD) process. The first metal layer 126 and second metal layer 128 formed in the openings 118 with the second isolation layer 122 and the first isolation layer 120 disposed between the first metal layer 126 and the substrate 100 form alignment marks 130 on the back side of the substrate 100. A person having ordinary skill in the art will readily understand that portions of the first and second metal layers 126 and 128, such as the portions between the TSVs 102, may be removed in subsequent processing steps, such as after the formation of copper pillars on the TSVs 102, to prevent short circuiting of the TSVs 102.

FIGS. 3A through 3H illustrate another method for forming an alignment mark on a substrate for a stacked device according to another embodiment, and FIGS. 4A through 4F illustrate a yet further method for forming an alignment mark according to a yet further embodiment. A structure produced by these methods is shown in FIG. 5. Any sequence herein described in the method is solely for clarity of description, and the steps of the method may be performed in any logical progression.

Figure 3A:
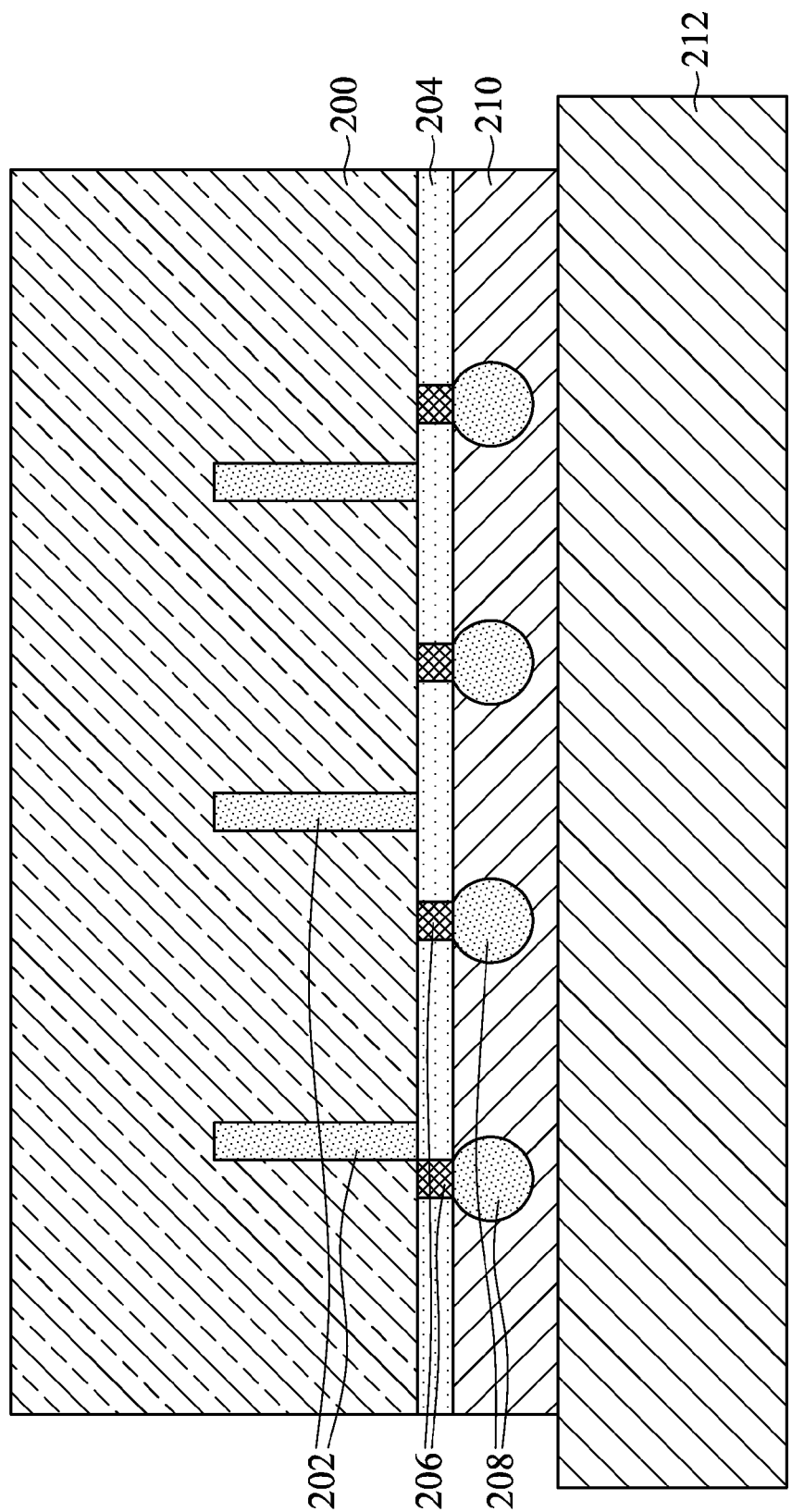
FIGS. 3A through 3H illustrate another method for forming an alignment mark on a substrate for a stacked device according to another embodiment.

The method as depicted in FIGS. 3A through 3H will be described first. FIG. 3A shows a substrate 200 in an intermediate stage of processing, such as after front side processing. Particularly, at this point in processing, through substrate vias (TSVs) 202 have been formed in the substrate 200, one or more metallization layers 204 with interconnect structures 206 have been formed on the substrate 200, and conductive bumps 208 have been formed electrically coupled to the interconnect structures 206. The substrate 200 may be any suitable material, such as silicon. The TSVs 202 may comprise a liner layer, a diffusion barrier layer, adhesion layer, and/or the like, and filled with a conductive material. The liner layer may be, for example, silicon nitride, silicon oxide, a polymer material, a combination thereof, and/or the like. The diffusion barrier layers, for example, may comprise one or more layers of TaN, Ta, TiN, Ti, CoW, or the like, and the conductive material may comprise, for example, copper, tungsten, aluminum, silver, combinations thereof, and/or the like, formed by an electro-chemical plating process. The metallization layers 204, interconnect structures 206, and conductive bumps 208 may be any acceptable material and formed with suitable processes, such as those known for BEOL processing.

Further, the front side of the substrate 200 has been attached by adhesive 210 to a carrier 212 for back side processing. Generally, the carrier 212 provides temporary mechanical and structural support during subsequent processing steps. In this manner, damage to the substrate 200 may be reduced or prevented. The carrier 212 may comprise, for example, glass, silicon oxide, aluminum oxide, and the like. The adhesive 210 may be any suitable adhesive, such as an ultraviolet (UV) glue, which loses its adhesive property when exposed to UV lights. It should be noted that reference numbers 204 through 212 are not explicitly identified in FIGS. 3B through 3H and 5; however, the features corresponding to these reference numbers are present in these figures. The omission of these reference numbers is merely for the clarity of the depictions.

Figure 3B:
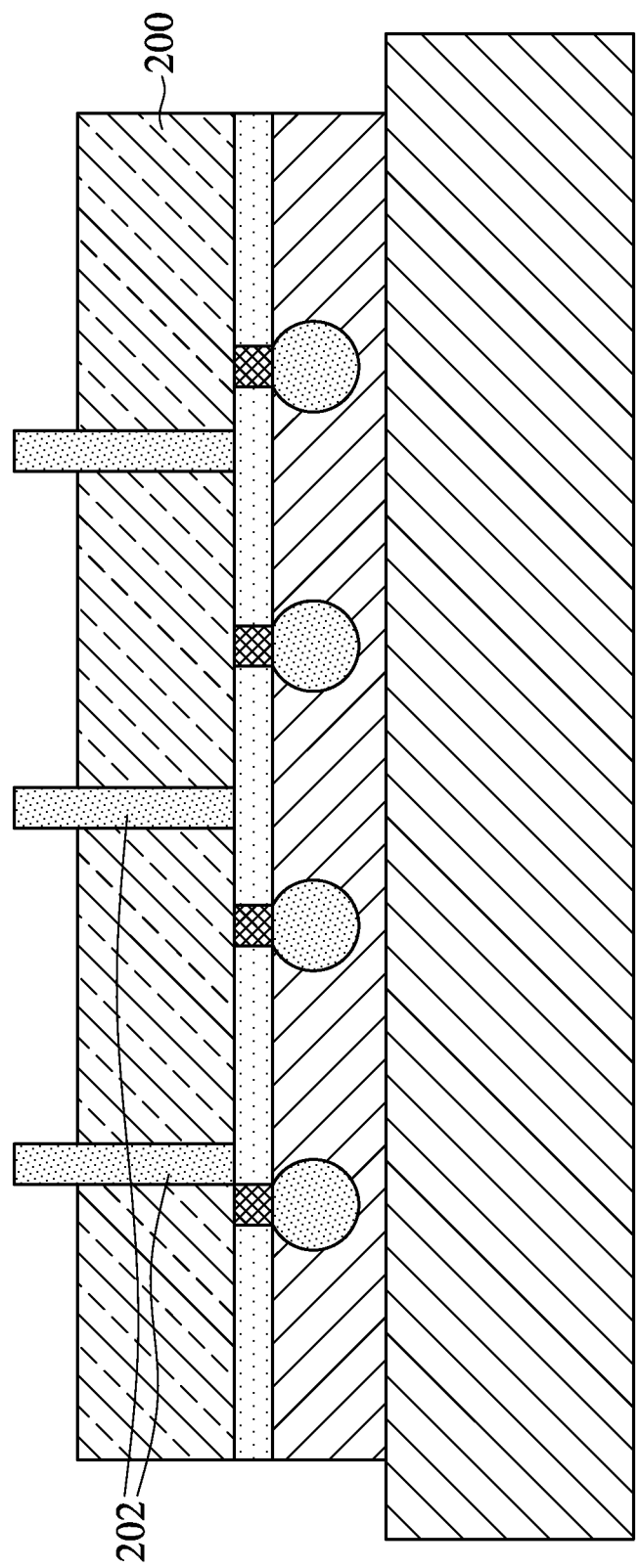

In FIG. 3B, the structure of FIG. 3A is shown after the substrate 200 is thinned and recessed to expose the TSVs 202 through the back side of the substrate 200. The thinning and recessing may result in the substrate 200 being a thin substrate, i.e. approximately 20 micrometers to approximately 200 micrometers in thickness. The thinning and recessing may be performed by a planarization process, an etch process, a combination thereof, and/or the like. For example, initially a planarizing process, such as a CMP, may be performed to initially expose top surfaces of the TSVs 202. Thereafter, one or more etching processes having a high etch-rate selectivity between the material of the TSVs 202 and the substrate 200 may be performed, thereby leaving the TSVs 202 protruding from the back side of the substrate 200.

Figure 3C:
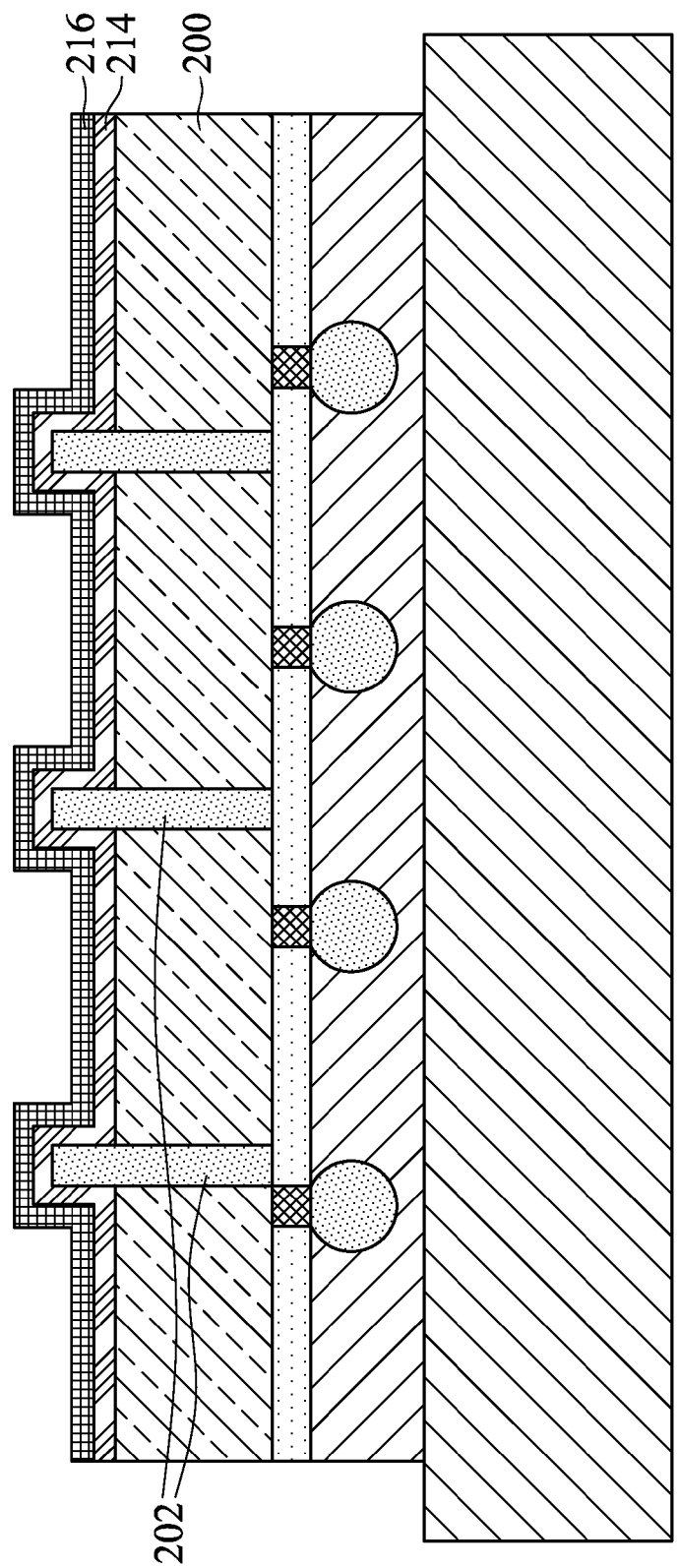

FIG. 3C illustrates the structure in FIG. 3B after the formation of a first isolation layer 214 and a second isolation layer 216. The first isolation layer 214 is formed over the back side of the substrate 200, and the second isolation layer 216 is formed over the first isolation layer 214. The first and second isolation layers 214 and 216 may be silicon nitride, silicon oxide, silicon carbide, silicon oxynitride, an oxide, a polymer material, a combination thereof, and/or the like. The first and second isolation layers 214 and 216 may further be a single layer or may be multiple layers consisting of the same or different material compositions. In the example shown in FIG. 3C, the first isolation layer 214 is a silicon nitride, and the second isolation layer 216 is a silicon oxide. The first and second isolation layers 214 and 216 may be deposited using acceptable deposition techniques, such as a CVD process or, further, by a CVD using a low temperature.

Figure 3D:
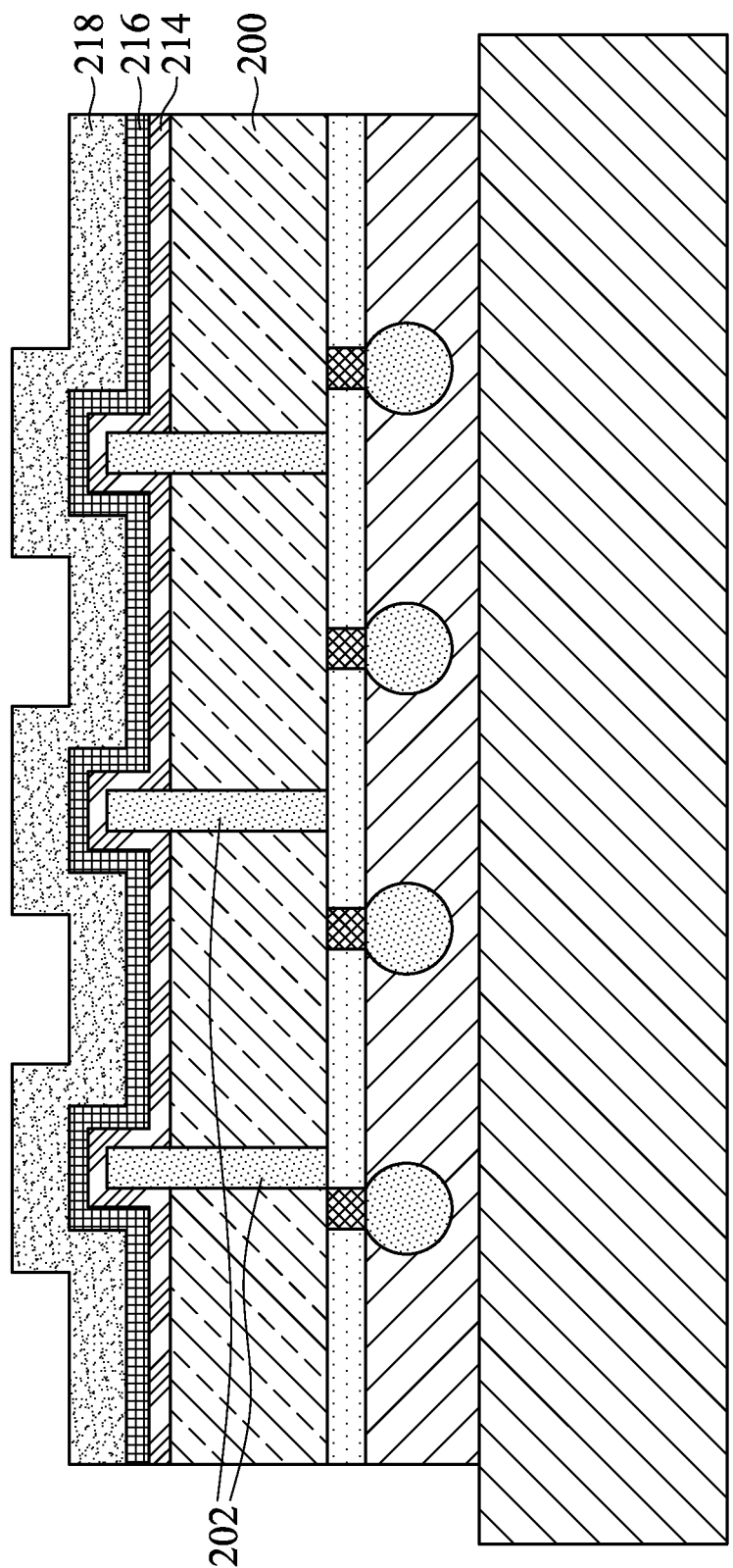
Figure 3E:
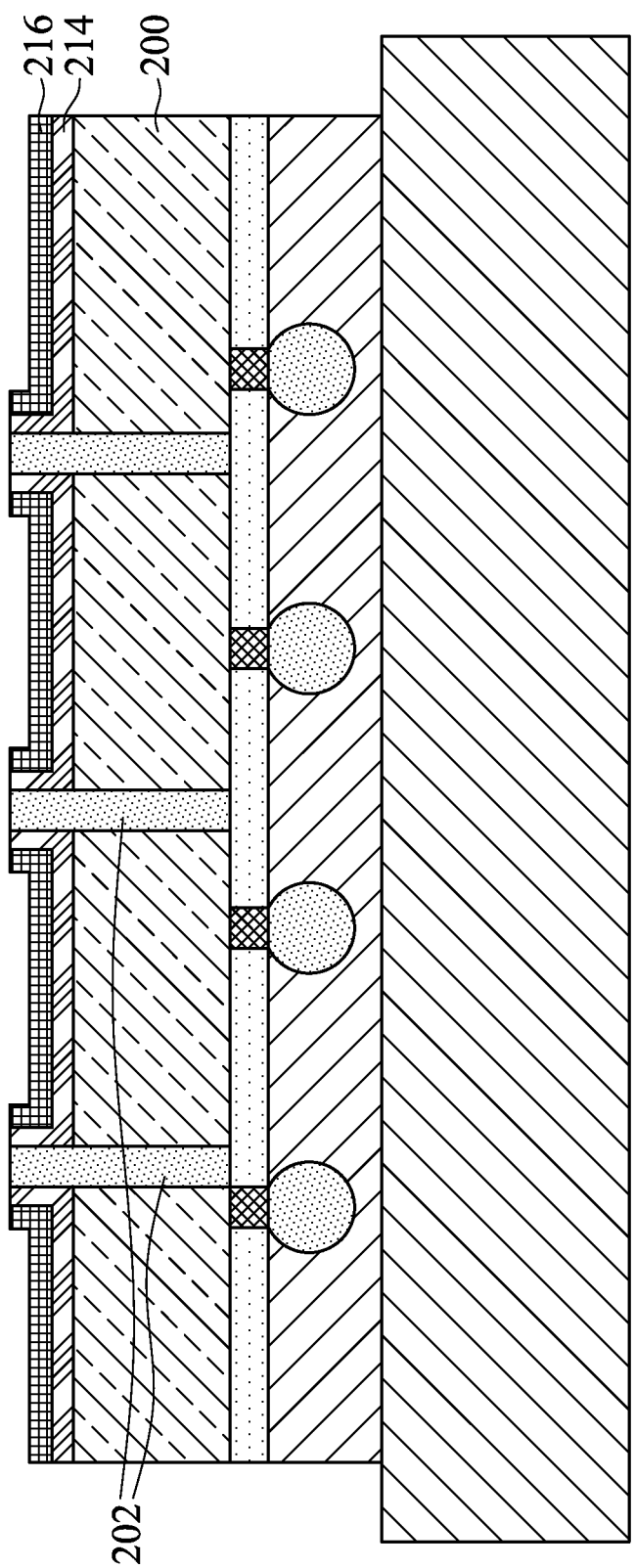

FIG. 3D shows a photoresist layer 218 formed over the second isolation layer 216. The photoresist layer 218 may be patterned, such as by exposing the photoresist layer 218 to light, to allow an etch process to remove portions of the first and second isolation layers 214 and 216 that coat the protruding portions of the TSVs 202. The first and second isolation layers 214 and 216 are then etched, such as by a dry etch, to allow the TSVs 202 to be exposed from under the first and second isolation layers 214 and 216, as shown in FIG. 3E. The etchant used for the etch process may have a high selectivity between the materials used for the TSVs 202 and the second isolation layer 216 and the first isolation layer 214. FIG. 3E further shows the structure after an ash/flush process is performed to remove the photoresist layer 218.

Figure 3F:
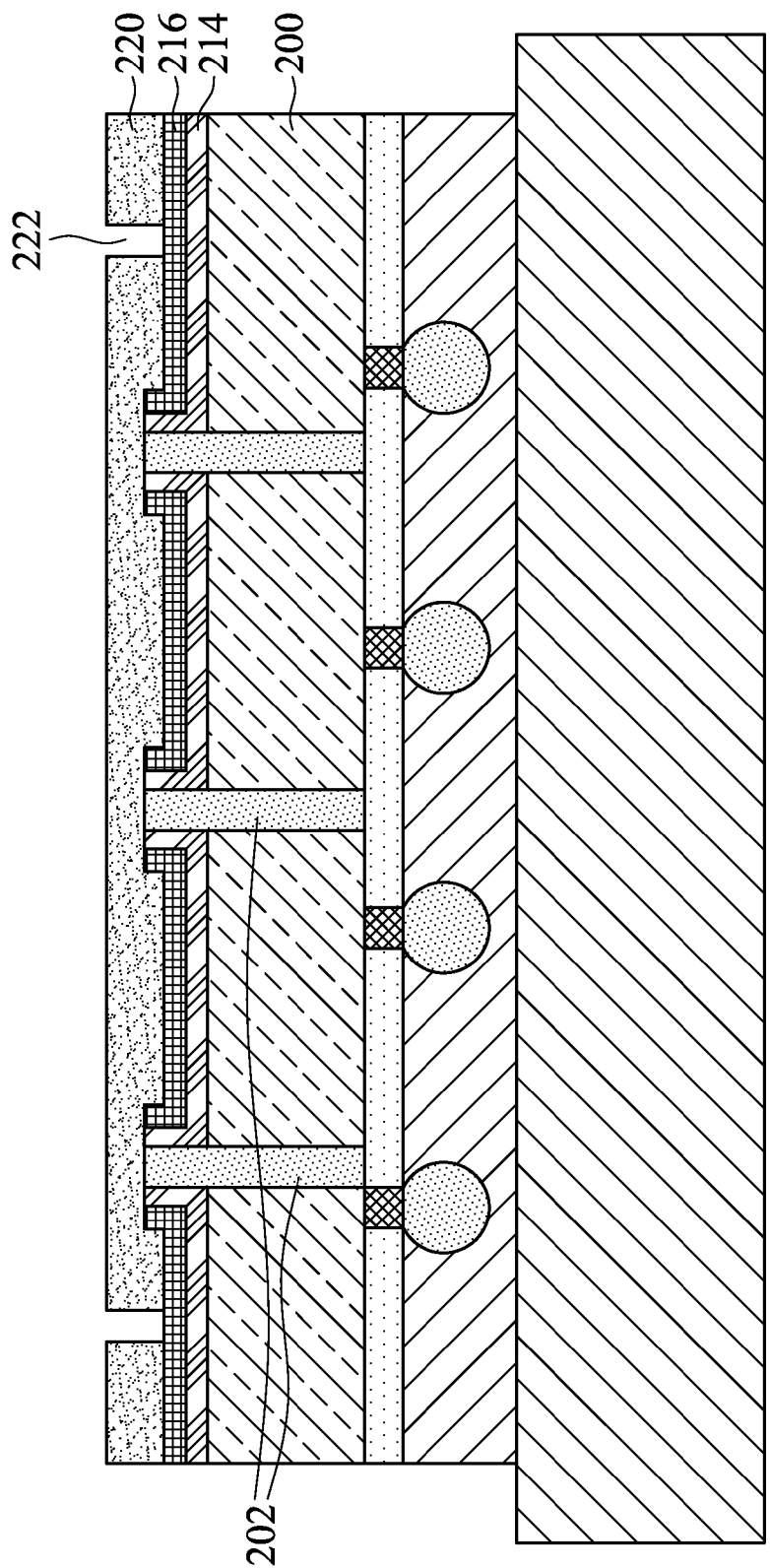
Figure 3G:
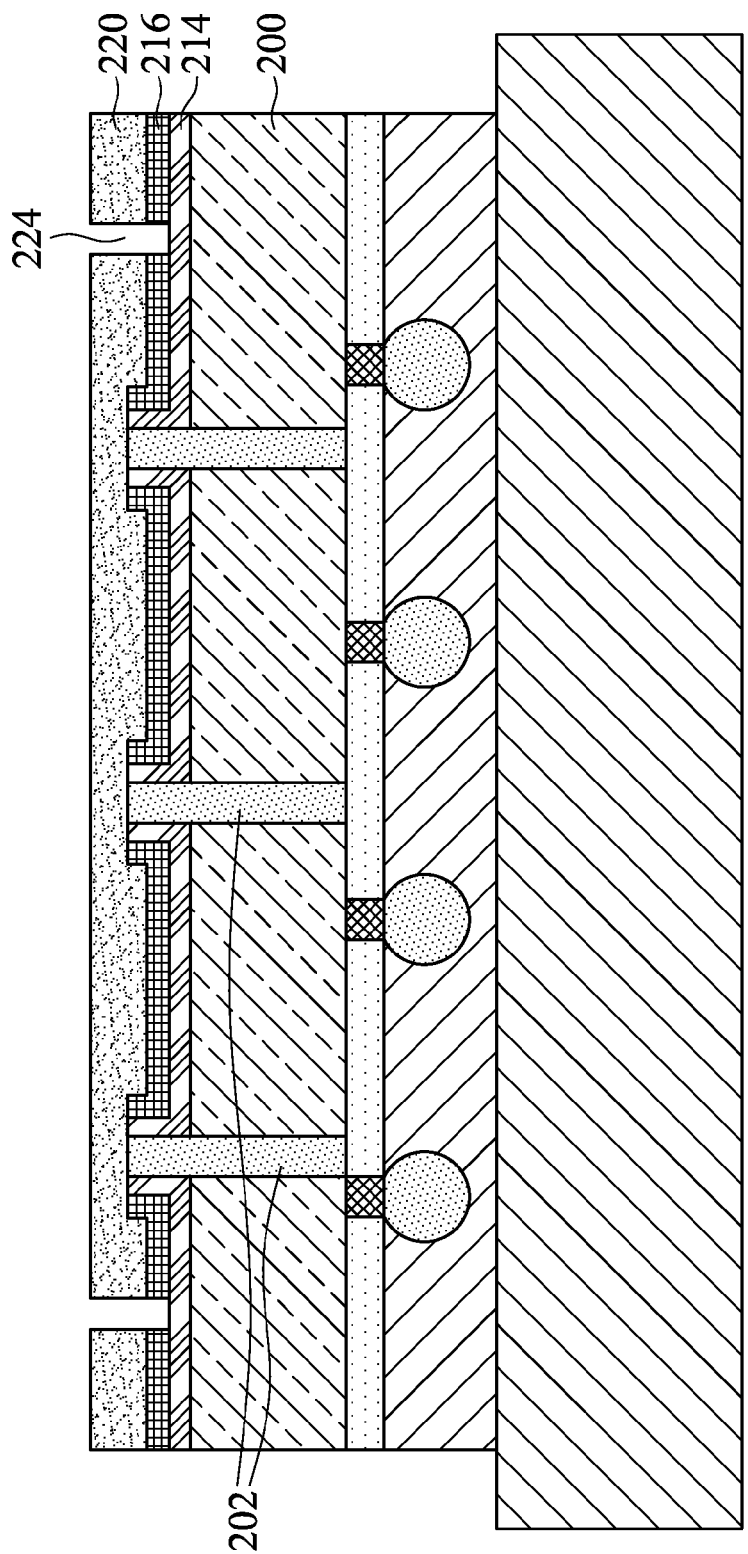
Figure 3H:
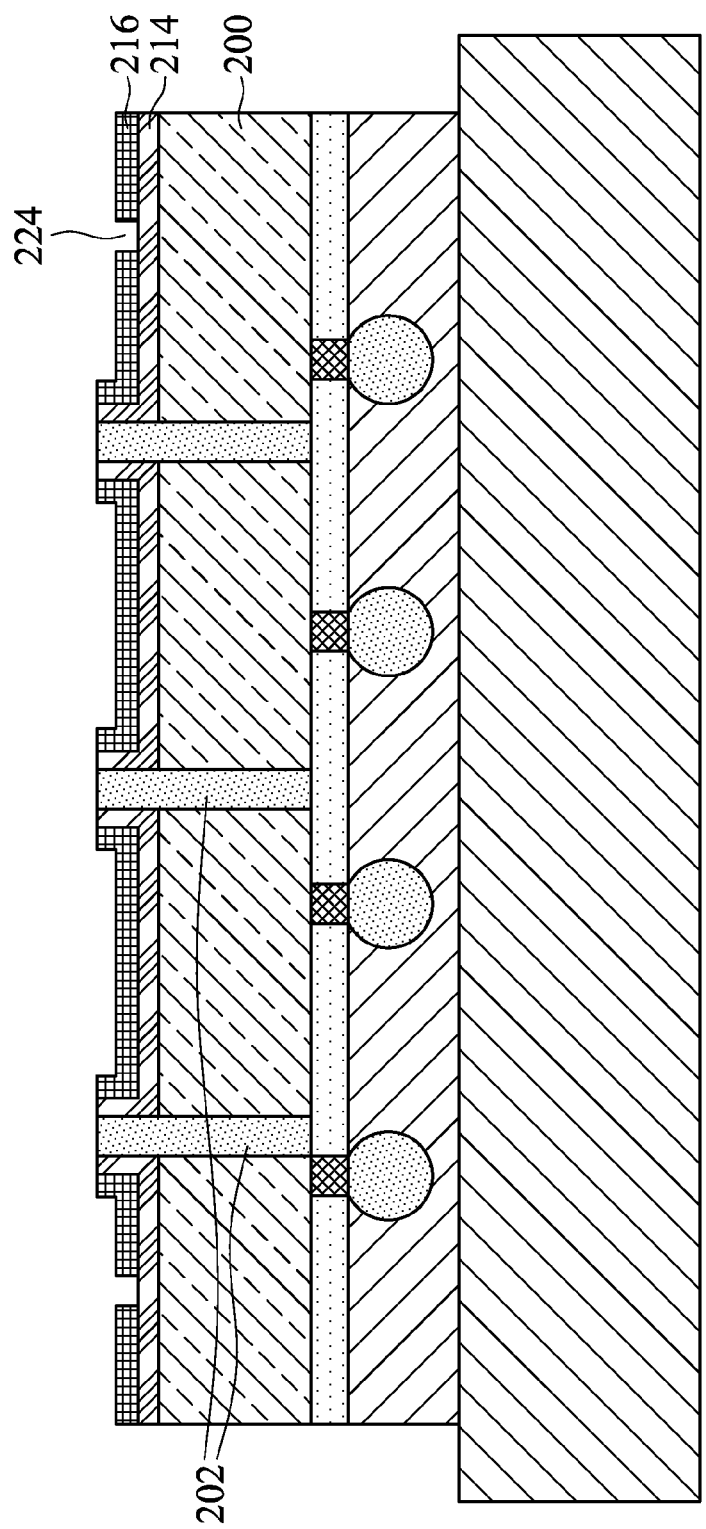

FIG. 3F shows a photoresist layer 220 formed over the second isolation layer 216. The photoresist layer 220 has openings 222 formed therein. The openings 222 may be formed using acceptable photolithography techniques, such as using a lithography mask to expose the photoresist layer 220 to light where openings 222 are to be formed. After the formation of the openings 222, an etch process, such as an anisotropic etch, is performed to create openings 224 recessed in the second isolation layer 216, as shown in FIG. 3G. The openings 224 may be recessed further into the first isolation layer 214, but not to or below the surface of the back side of the substrate 200. FIG. 3H shows the structure of FIG. 3G after an ash/flush process is performed to remove the photoresist layer 220.

The method as depicted in FIGS. 4A through 4F will now be described. The method proceeds in FIGS. 4A through 4C as previous discussed with respect to FIGS. 3A through 3C. Therefore, discussion of these steps is omitted for brevity. Further, like reference numbers refer to the same or similar features and/or materials in FIGS. 3A through 3C and FIGS. 4A through 4C.

Figure 4A:
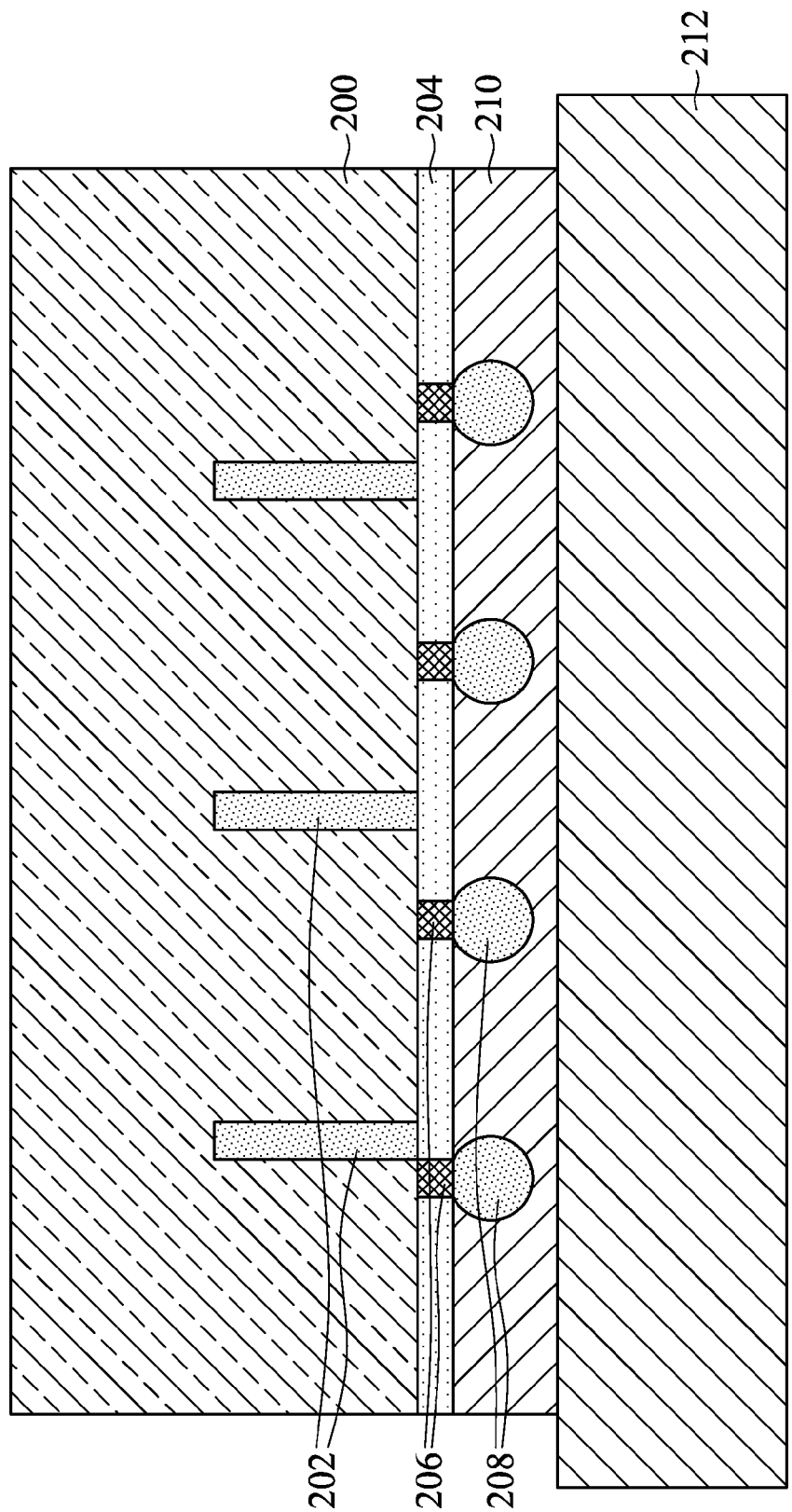
FIGS. 4A through 4F illustrate a yet further method for forming an alignment mark according to a yet further embodiment.
Figure 4B:
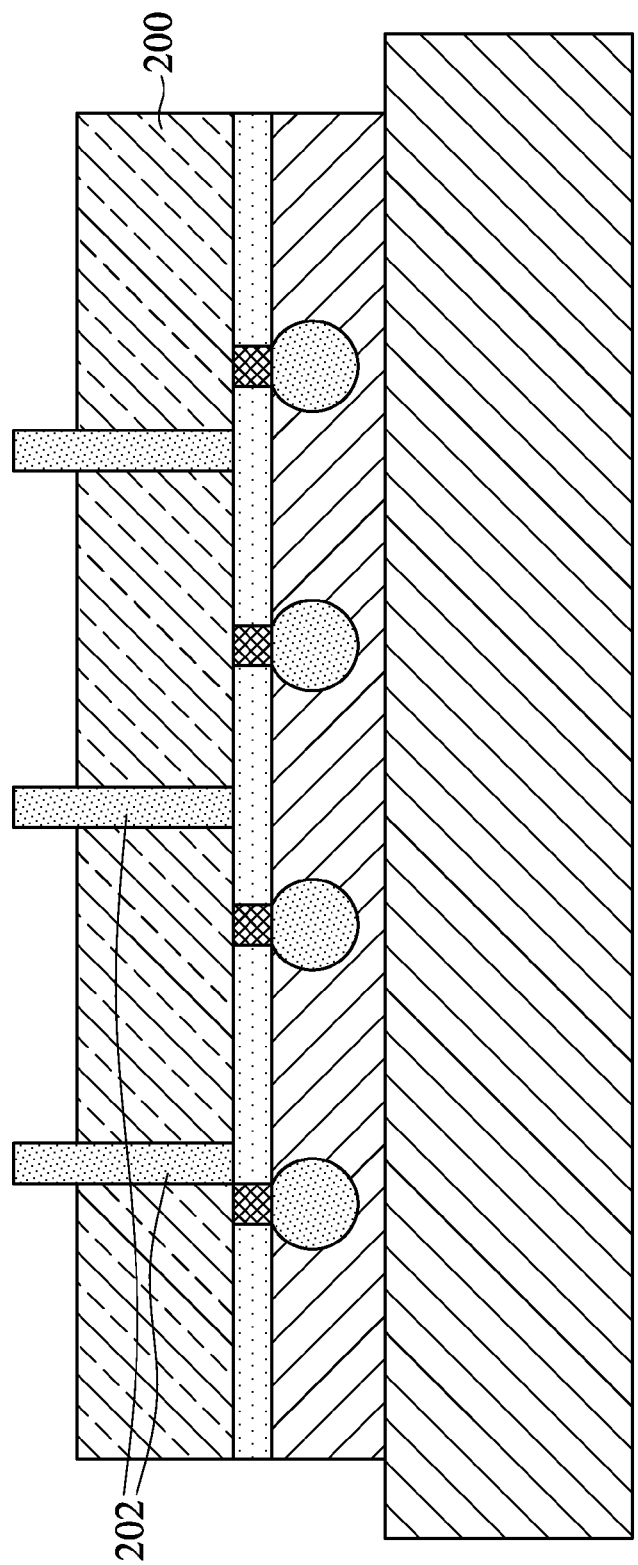
Figure 4C:
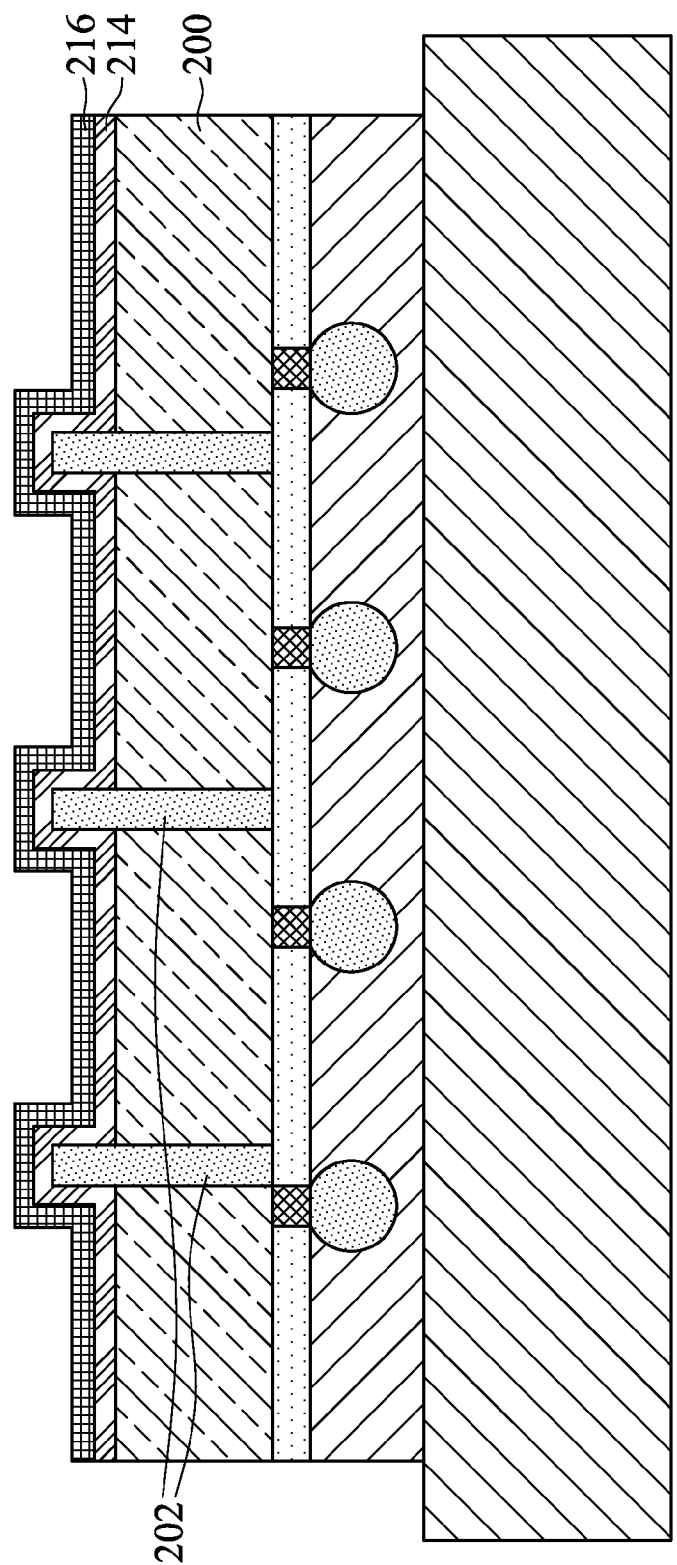
Figure 4D:
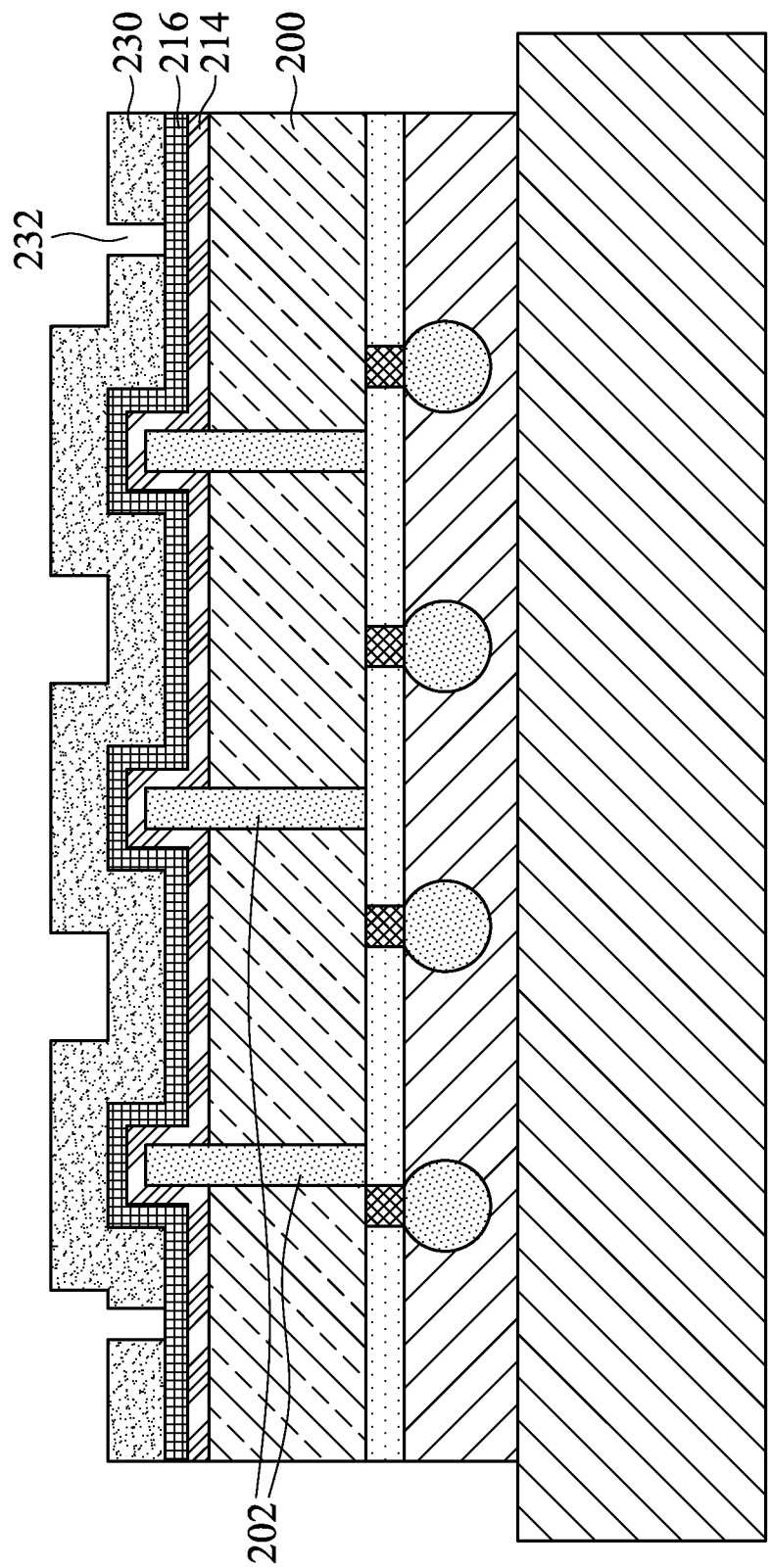
Figure 4E:
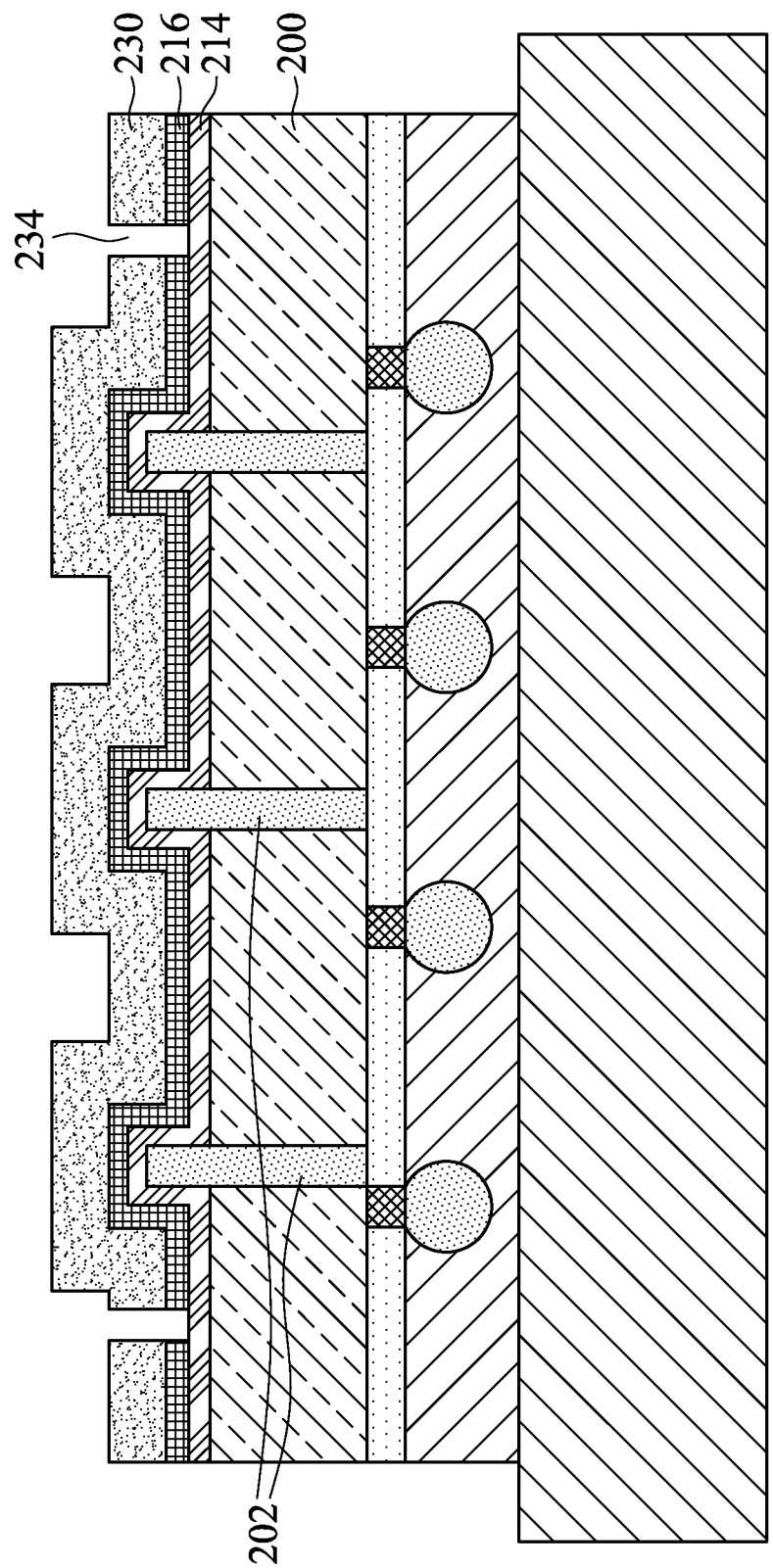
Figure 4F:
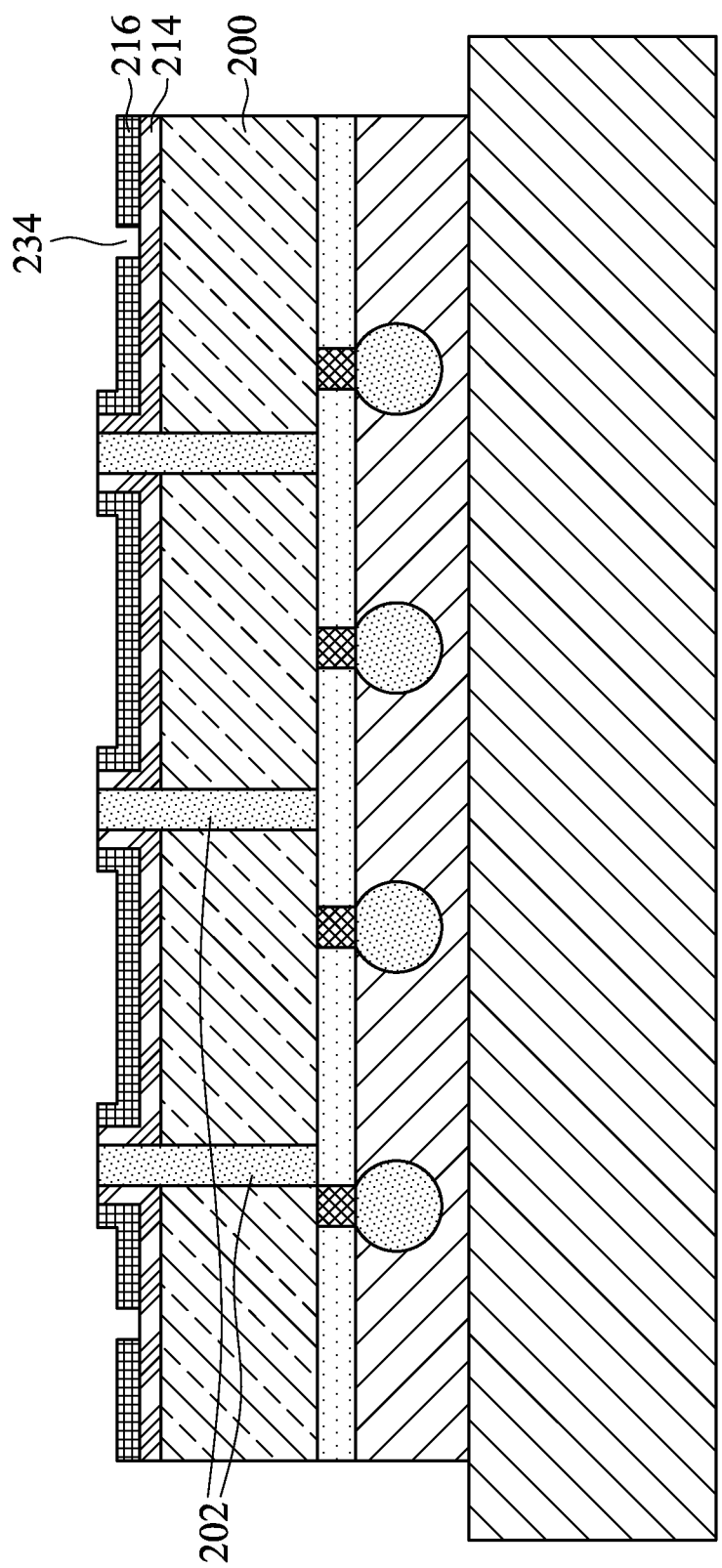
Figure 5:
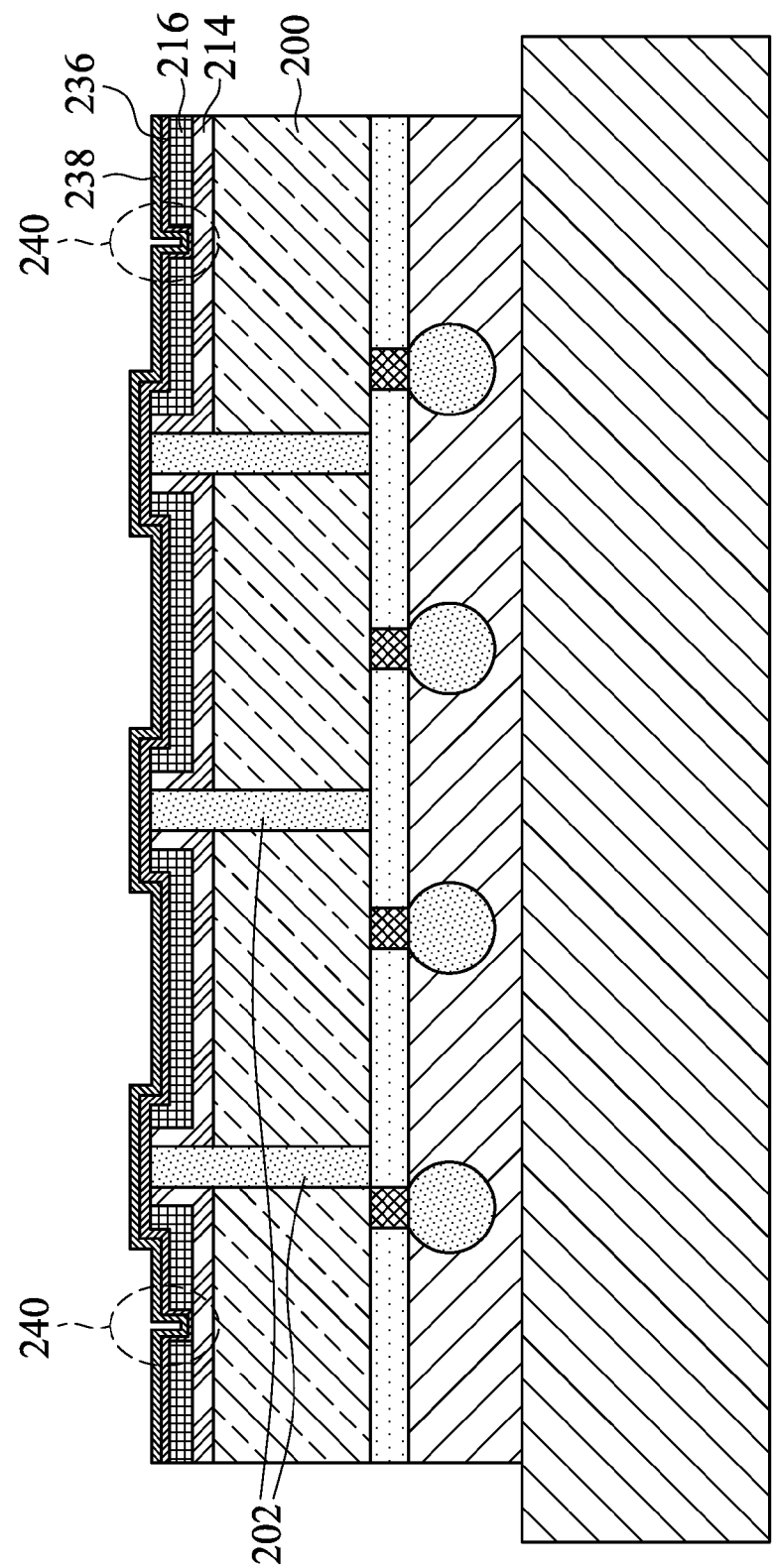
FIG. 5 illustrates a structure having an alignment mark formed by either of the methods described with respect to FIGS. 3A through 3H or FIGS. 4A through 4F.

FIG. 4D shows a photoresist layer 230 formed over the second isolation layer 216. The photoresist layer 230 has openings 232 formed therein. The openings 232 may be formed using acceptable photolithography techniques, such as using a lithography mask to expose the photoresist layer 230 to light. The second isolation layer 216 is then etched, such as by an anisotropic etch, to create openings 234 recessed in the second isolation layer 216, as shown in FIG. 4E. The etchant used for the etch process may have a high selectivity between the materials used for the second isolation layer 216 and the first isolation layer 214. Afterwards, a planarization process, such as a CMP, may be used to remove portions of the first and second isolation layer 214 and 216 over the TSVs 202 to allow the TSVs 202 to be exposed at an upper surface, as shown in FIG. 4F. FIG. 4F further shows the structure after an ash/flush process is performed to remove the photoresist layer 230.

FIG. 5 illustrates a structure having an alignment mark 240 formed by either of the methods described with respect to FIGS. 3A through 3H or FIGS. 4A through 4F. As shown in FIG. 5, the structure of FIG. 3H or 4F further comprises a first metal layer 236 and a second metal layer 238. The first metal layer 236 may be Ti, TiN, TiW, TiSiN, Ta, TaN, TaSiN, W, $W_2N$, WSiN, a combination thereof, and/or the like, and the second metal layer 238 may be copper and/or the like. The first metal layer 236 and the second metal layer 238 may be formed using a suitable deposition technique, such as by a PVD process, a CVD process, or an ALD process. The first metal layer 236 and second metal layer 238 formed in the openings 234 with the first isolation layer 214 disposed between the first metal layer 236 and the substrate 300 form alignment marks 240 on the back side of the substrate 200. A person having ordinary skill in the art will readily understand that portions of the first and second metal layers 236 and 238, such as the portions between the TSVs 202, may be removed in subsequent processing steps, such as after the formation of copper pillars on the TSVs 202, to prevent the shorting of the TSVs 202.

Embodiments may prevent diffusion of metal in the alignment mark. The isolation layer(s) may form a barrier layer to prevent a metal, such as copper, from diffusing into the substrate in the embodiments. By preventing diffusion, devices and structures formed in the substrate are less likely to be inoperable because of shorting or other problems that may be caused by diffusion of the metal in the alignment mark.

Also, the structures and processes of the embodiments discussed above may provide increased throughput from a process flow. Further, they may ease stress and strain in the thinned substrate because of an improved process flow, such as because of lower temperatures being used.

In accordance with an embodiment, a structure comprises a substrate having a first area and a second area; a through substrate via (TSV) in the substrate penetrating the first area of the substrate; an isolation layer over the second area of the substrate, the isolation layer having a recess; and a conductive material in the recess of the isolation layer, the isolation layer being disposed between the conductive material and the substrate in the recess.

Another embodiment is a structure having an alignment mark. The structure comprises a substrate comprising a through substrate via (TSV), the TSV extending from a front surface of the substrate to a back surface of the substrate; an isolation layer over the back surface of the substrate, the isolation layer having a cavity; and a conductor positioned in the cavity, the isolation layer being disposed between the conductor and the substrate in the cavity.

A yet further embodiment is a method for forming a stacked device. The method comprises providing a substrate having a through substrate via (TSV) protruding from a back side; forming an isolation layer over the back side of the substrate, the isolation layer having a recess; and forming a conductive layer in the recess, the isolation layer being disposed between the conductive layer and the substrate in the recess.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a substrate having a surface, a through via being in the substrate and protruding from the surface of the substrate;
   an isolation layer on the surface of the substrate, the isolation layer defining a first recess having isolation sidewalls and an isolation bottom surface;
   a first conductive layer in the first recess conformally lining the isolation sidewalls and the isolation bottom surface; and
   a second conductive layer over and conformal to the first conductive layer, the second conductive layer having a second composition different from a first composition of the first conductive layer.

2. The structure of claim 1, wherein the substrate comprises a second recess extending from the surface into the substrate, the first recess being in the second recess, the isolation layer conformally lining the second recess to define the first recess in the second recess.

3. The structure of claim 1, wherein the first recess does not extend into the substrate.

4. The structure of claim 1, wherein the isolation layer comprises a first sublayer and a second sublayer on the first sublayer, the first sublayer having a different composition from the second sublayer.

5. The structure of claim 4, wherein the first sublayer conformally lines a second recess in the substrate extending from the surface of the substrate, and the second sublayer conformally lines the first sublayer in the second recess, the second sublayer defining the first recess, surfaces of the second sublayer being the isolation sidewalls and the isolation bottom surface.

6. The structure of claim 4, wherein the first recess is through the second sublayer, surfaces of the second sublayer being the isolation sidewalls, and a surface of the first sublayer being the isolation bottom surface.

7. The structure of claim 1, wherein the conductive layer lines at least a portion of the isolation layer outside of the first recess.

8. The structure of claim 1, wherein the conductive layer is electrically insulated through the first recess.

9. A structure comprising:
   a substrate having a surface, a through via being in the substrate and protruding from the surface of the substrate, the substrate having a recess extending from the surface to a depth in the substrate;
   an isolation layer on the surface of the substrate and conformally lining sidewalls of the recess, a bottom surface of the recess, and sidewalls of an upper portion of the through via protruding from the surface of the substrate, wherein an upper surface of the isolation layer is level with an upper surface of the through via distal the substrate; and
   a conductive material on the isolation layer and in the recess.

10. The structure of claim 9, wherein the conductive material conformally lines the isolation layer in the recess.

11. The structure of claim 9, wherein the conductive material lines at least a portion of the isolation layer outside of the recess.

12. The structure of claim 9, wherein the isolation layer comprises a first sublayer and a second sublayer on the first sublayer, the first sublayer having a different composition from the second sublayer.

13. The structure of claim 12, wherein the first sublayer conformally lines the recess in the substrate, and the second sublayer conformally lines the first sublayer in the recess.

14. The structure of claim 9, wherein the conductive material is electrically insulated through the recess.

15. A structure comprising:
   a substrate having a surface, a through via formed in an opening in the substrate and protruding from the surface of the substrate, sidewalls of the opening in the substrate contacting the through via;
   an isolation layer on the surface of the substrate, the isolation layer defining a first recess having isolation sidewalls that extend to and contact an isolation bottom surface, the isolation layer having a first sublayer and a second sublayer on the first sublayer, the first sublayer having a different composition from the second sublayer; and
   a conductive layer in the first recess having a substantially same thickness throughout the conductive layer along and in respective directions perpendicular to the isolation sidewalls and the isolation bottom surface.

16. The structure of claim 15, wherein the first sublayer conformally lines a second recess in the substrate extending from the surface of the substrate, and the second sublayer conformally lines the first sublayer in the second recess, the second sublayer defining the first recess, surfaces of the second sublayer being the isolation sidewalls and the isolation bottom surface.

17. The structure of claim 15, wherein the first recess is through the second sublayer, surfaces of the second sublayer being the isolation sidewalls, and a surface of the first sublayer being the isolation bottom surface.

18. The structure of claim 15, wherein the conductive layer is electrically insulated through the first recess.

19. The structure of claim 15, wherein the through via comprises a liner layer, a diffusion barrier layer, an adhesion layer, or combinations thereof.

20. The structure of claim 15, wherein the conductive layer comprises a first sublayer and a second sublayer on the first sublayer, the first sublayer having a different composition from the second sublayer.

* * * * *